(12) United States Patent
Chiu et al.

(10) Patent No.: US 11,491,510 B2
(45) Date of Patent: Nov. 8, 2022

(54) SEMICONDUCTOR DEVICE HAVING MICROELECTROMECHANICAL SYSTEMS DEVICES WITH IMPROVED CAVITY PRESSURE UNIFORMITY

(71) Applicant: Taiwan Semiconductor Manufacturing Co., Ltd., Hsin-Chu (TW)

(72) Inventors: I-Hsuan Chiu, Hsin-Chu (TW); Chia-Ming Hung, Taipei (TW); Li-Chun Peng, Hsin-Chu (TW); Hsiang-Fu Chen, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 249 days.

(21) Appl. No.: 15/930,570

(22) Filed: May 13, 2020

(65) Prior Publication Data
US 2021/0060610 A1 Mar. 4, 2021

Related U.S. Application Data

(60) Provisional application No. 62/892,106, filed on Aug. 27, 2019.

(51) Int. Cl.
*H01L 21/00* (2006.01)
*B06B 1/02* (2006.01)
(Continued)

(52) U.S. Cl.
CPC .......... *B06B 1/0292* (2013.01); *B81B 3/0021* (2013.01); *B81C 1/00158* (2013.01); *B81B 2201/0271* (2013.01); *B81B 2203/0127* (2013.01); *B81B 2203/0315* (2013.01); *B81B 2207/012* (2013.01); *B81B 2207/07* (2013.01); *B81C 2203/036* (2013.01); *B81C 2203/0792* (2013.01)

(58) Field of Classification Search
CPC ................ B06B 1/0292; B81B 3/0021; B81B 2201/0271; B81B 2201/127; B81B 2207/012; B81B 2207/07; B81C 1/00158; B81C 2203/036; B81C 2203/0792
See application file for complete search history.

(56) References Cited

U.S. PATENT DOCUMENTS 8,716,852 B2 5/2014 Shu et al.
9,365,416 B2 6/2016 Shu et al.
(Continued)

*Primary Examiner* — Samuel A Gebremariam
(74) *Attorney, Agent, or Firm* — Eschweiler & Potashnik, LLC

(57) ABSTRACT

Various embodiments of the present disclosure are directed towards a semiconductor device. The semiconductor device includes an interconnect structure disposed over a semiconductor substrate. A dielectric structure is disposed over the interconnect structure. A plurality of cavities are disposed in the dielectric structure. A microelectromechanical system (MEMS) substrate is disposed over the dielectric structure, where the MEMS substrate comprises a plurality of movable membranes, and where the movable membranes overlie the cavities, respectively. A plurality of fluid communication channels are disposed in the dielectric structure, where each of the fluid communication channels extend laterally between two neighboring cavities of the cavities, such that each of the cavities are in fluid communication with one another.

20 Claims, 23 Drawing Sheets

(51) Int. Cl.
*B81B 3/00* (2006.01)
*B81C 1/00* (2006.01)

(56) References Cited

U.S. PATENT DOCUMENTS

| | | |
|---|---|---|
| 9,567,204 B2 | 2/2017 | Hung et al. |
| 2016/0347609 A1 | 12/2016 | Yu et al. |
| 2018/0148326 A1 | 5/2018 | Cheng et al. |
| 2019/0103352 A1 | 4/2019 | Chou |

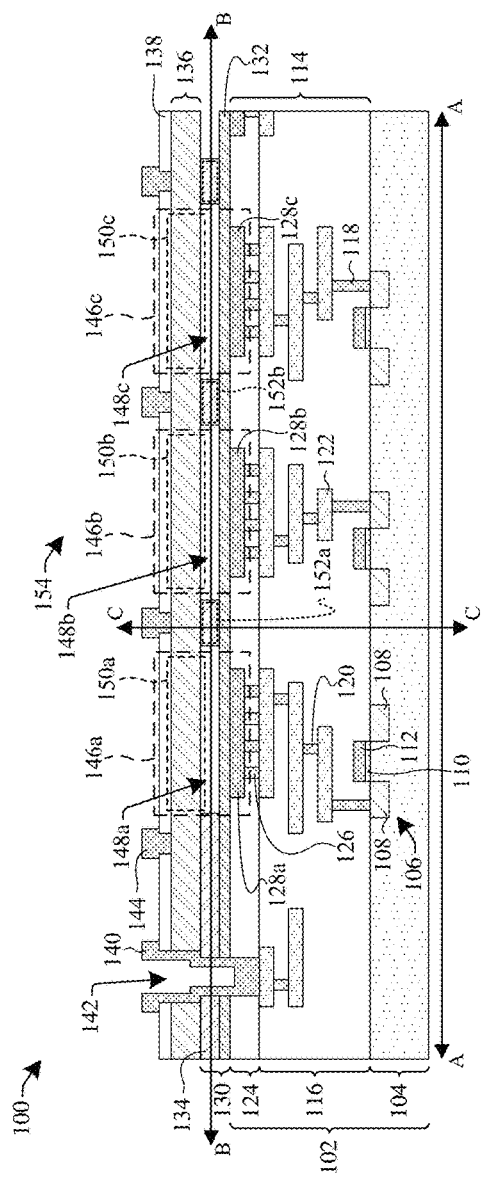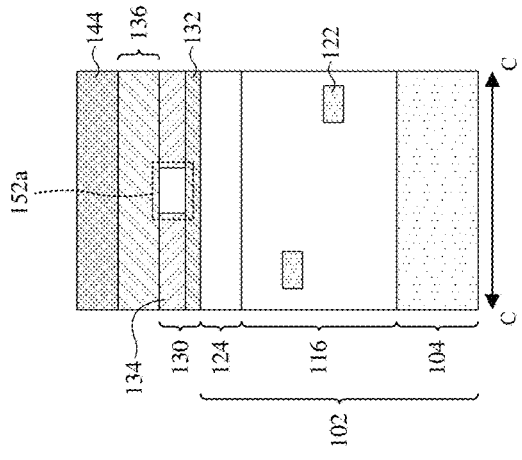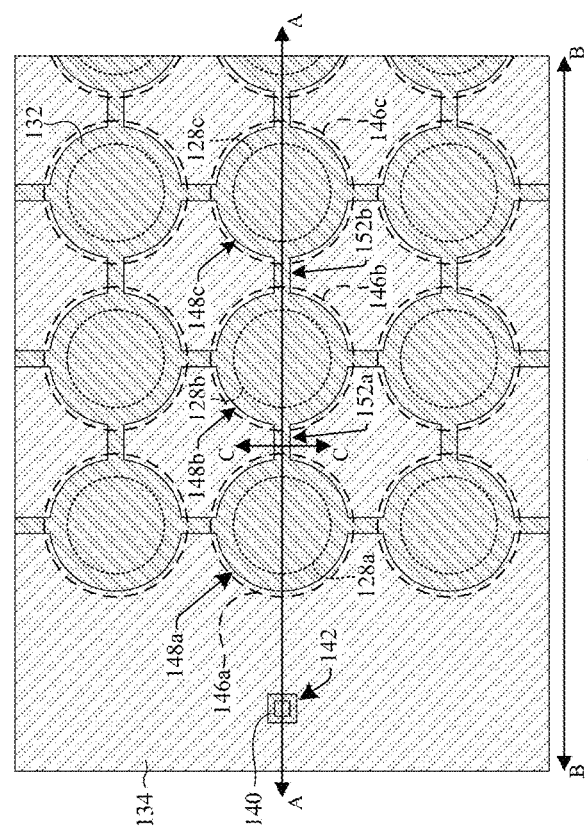
Fig. 2A
Fig. 2B
Fig. 2C

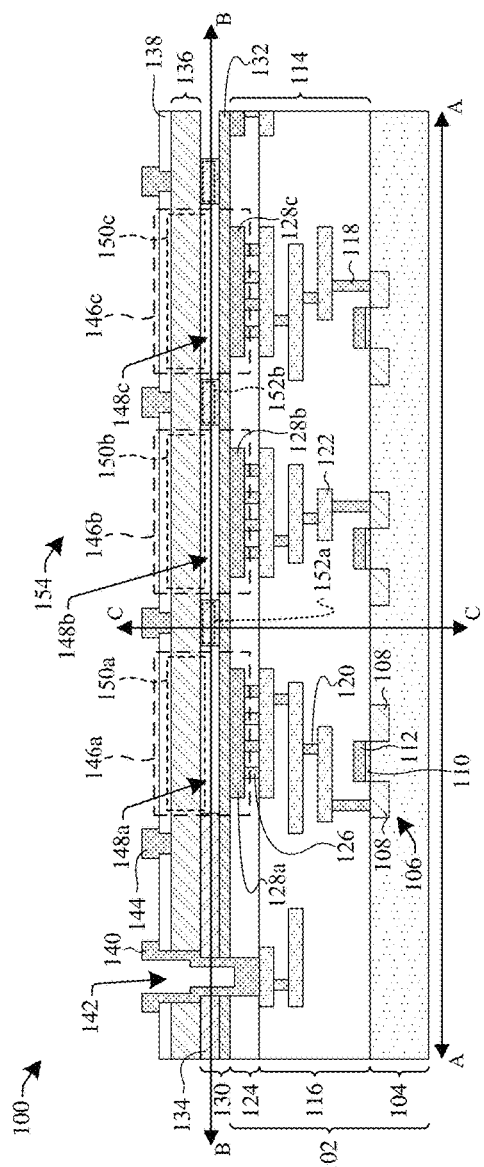
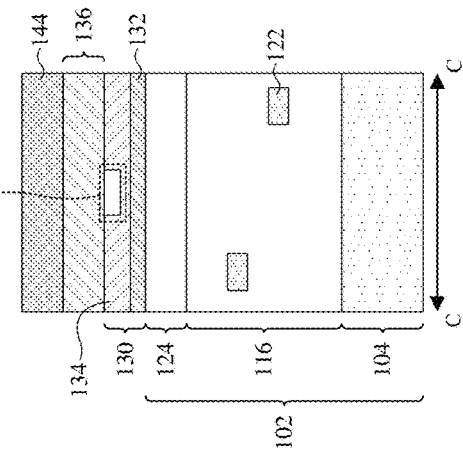
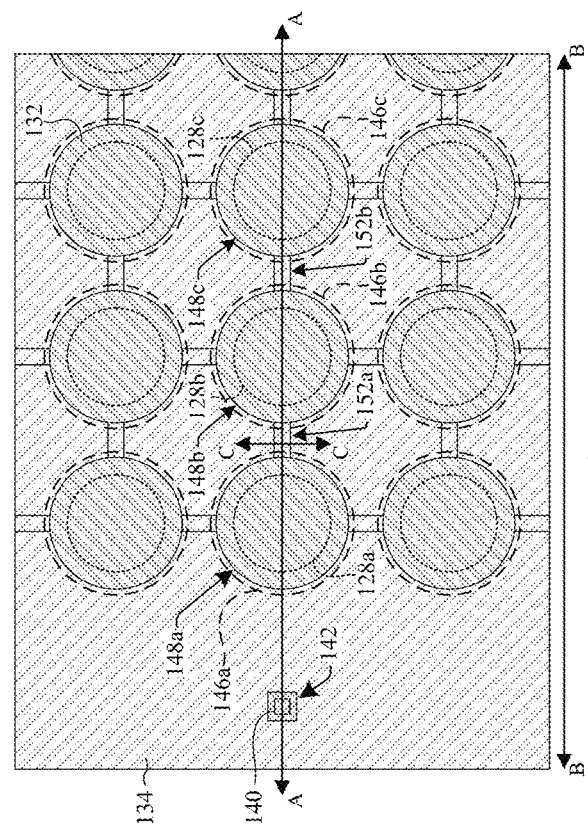
Fig. 3A
Fig. 3B
Fig. 3C

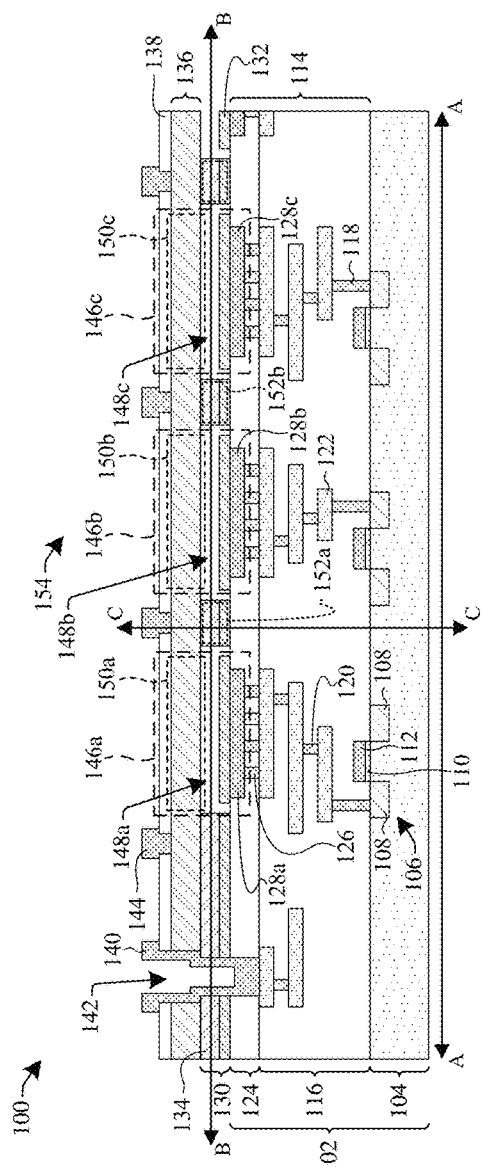
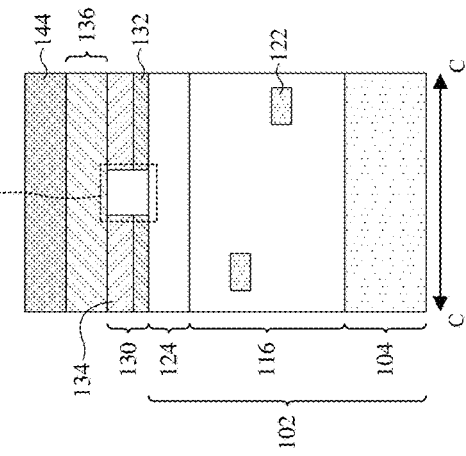
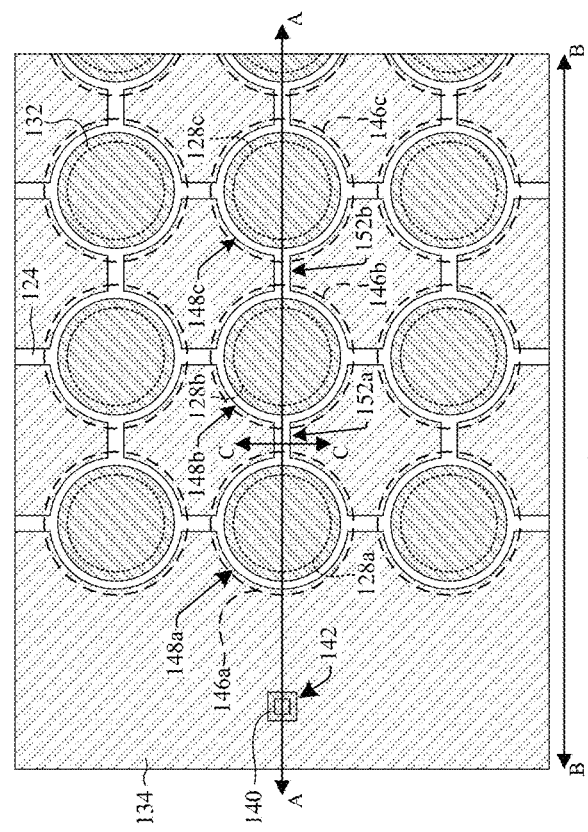
Fig. 4A
Fig. 4B
Fig. 4C

SEMICONDUCTOR DEVICE HAVING MICROELECTROMECHANICAL SYSTEMS DEVICES WITH IMPROVED CAVITY PRESSURE UNIFORMITY

REFERENCE TO RELATED APPLICATION

This Application claims the benefit of U.S. Provisional Application No. 62/892,106, filed on Aug. 27, 2019, the contents of which are hereby incorporated by reference in their entirety.

BACKGROUND

Microelectromechanical systems (MEMS) is a technology that integrates miniaturized mechanical and electromechanical elements on an integrated chip. MEMS devices are often made using micro-fabrication techniques. In recent years, MEMS devices have found a wide range of applications. For example, MEMS devices are found in cell phones (e.g., accelerometers, gyroscopes, digital compasses), pressure sensors, micro-fluidic elements (e.g., valves, pumps), optical switches (e.g., mirrors), imaging devices (e.g., micromachined ultrasonic transducers (MUTs)), etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2C illustrate various views of some embodiments of the semiconductor device of FIG. 1.

FIGS. 3A-3C illustrate various views of some other embodiments of the semiconductor device of FIG. 1.

FIGS. 4A-4C illustrate various views of some other embodiments of the semiconductor device of FIG. 1.

DETAILED DESCRIPTION

Figure 1:
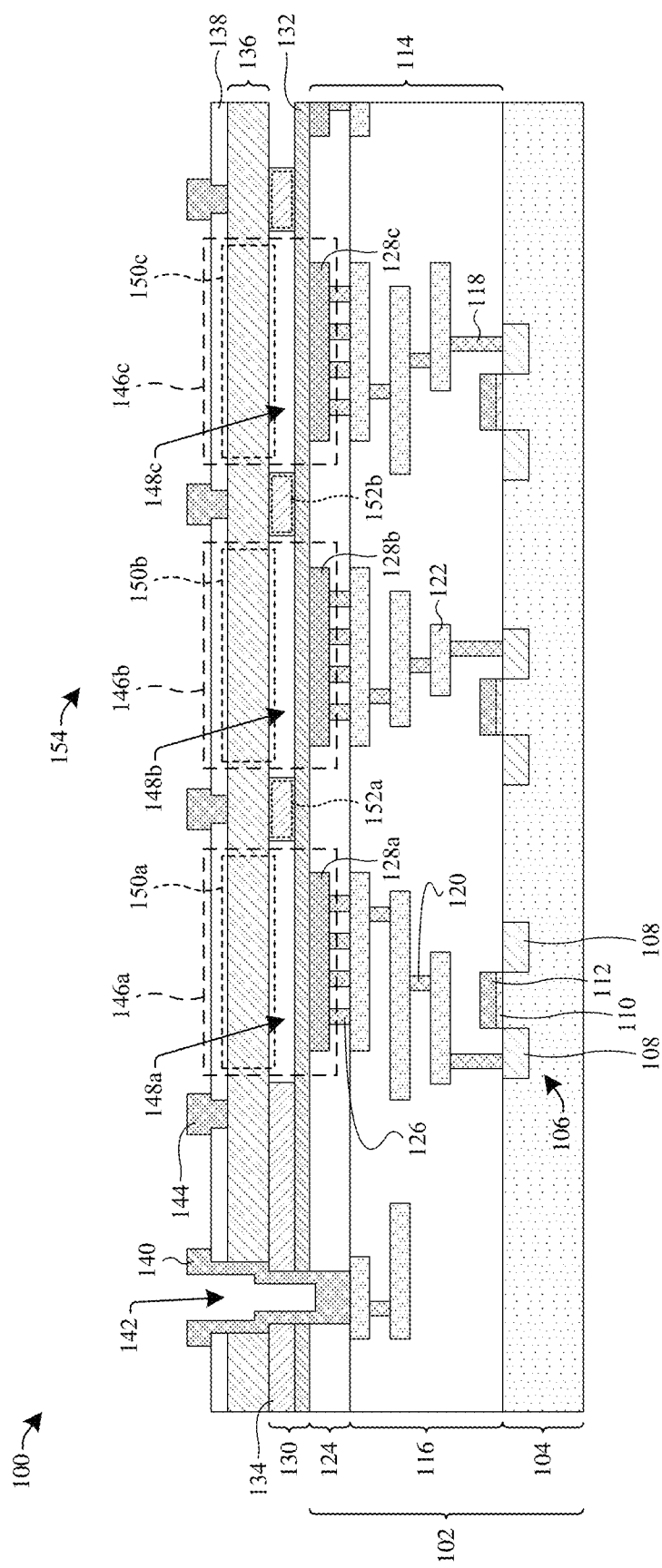
FIG. 1 illustrates a cross-sectional view of some embodiments of a semiconductor device having microelectromechanical system (MEMS) devices with improved cavity pressure uniformity.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a semiconductor device comprises a microelectromechanical systems (MEMS) transducer. The MEMS transducer comprises a plurality of baseline MEMS devices. The baseline MEMS devices are disposed over a semiconductor substrate of the semiconductor device. Each of the baseline MEMS devices comprises a cavity and a movable membrane. Typically, each of the cavities are discrete from one another (e.g., the cavities are spaced from one another and not in fluid communication with one another).

One challenge with the above MEMS transducer is the discrete cavities having different cavity pressures, which negatively affects device performance of the MEMS transducer. For example, a first baseline MEMS device of the plurality of baseline MEMS devices comprises a first cavity having a first cavity pressure (e.g., a pressure inside a first discrete cavity), and a second baseline MEMS device of the plurality of baseline MEMS devices comprises a second cavity having a second cavity pressure (e.g., a pressure inside a second discrete cavity) that is different than the first cavity pressure. The difference between the first cavity pressure and the second cavity pressure negatively affects the device performance of the MEMS transducer (e.g., reduces the transmission/receiving sensitivity of the MEMS transducer). Differences in the cavity pressures may be caused by process variations in the formation of the semiconductor device (e.g., different outgassing rates, time variations in sealing the cavities, pressure variation in a processing chamber, etc.).

Various embodiments of the present application are directed toward a semiconductor device having MEMS devices with improved cavity pressure uniformity. The semiconductor device comprises an interconnect structure disposed over a semiconductor substrate. A dielectric structure is disposed over the interconnect structure. A microelectromechanical system (MEMS) substrate is disposed over the dielectric structure. A first MEMS device is disposed over the interconnect structure. The first MEMS device comprises a first cavity disposed in the dielectric structure, and a first movable membrane of the MEMS substrate that overlies the first cavity. A second MEMS device is disposed over the interconnect structure and laterally spaced from the first MEMS device. The second MEMS device comprises a second cavity disposed in the dielectric structure, and a second movable membrane of the MEMS substrate that overlies the second cavity. A fluid communication channel is disposed in the dielectric structure. The fluid communication channel extends laterally from the first cavity to the second cavity, such that the first cavity and the second cavity are in fluid communication. Because the first cavity and the second cavity are in fluid communication with one another, a first cavity pressure of the first cavity (e.g., a pressure inside the first cavity) is substantially the same as a second cavity pressure of the second cavity. Thus, the fluid communication channel may improve the device performance of the semiconductor device (e.g., increased transmission/receiving sensitivity).

FIG. 1 illustrates a cross-sectional view of some embodiments of a semiconductor device 100 having microelectromechanical system (MEMS) devices with improved cavity pressure uniformity.

As shown in FIG. 1, the semiconductor device 100 comprises an integrated circuit (IC) structure 102. The IC structure 102 comprises a semiconductor substrate 104. The semiconductor substrate 104 may comprise any type of semiconductor body (e.g., monocrystalline silicon/CMOS bulk, silicon-germanium (SiGe), silicon on insulator (SOI), etc.).

In some embodiments, one or more IC devices 106 are disposed on/over the semiconductor substrate 104. The IC devices 106 may be or comprise, for example, active electronic devices (e.g., transistors), passive electronic devices (e.g., resistors, capacitors, inductors, fuses, etc.), some other electronic devices, or a combination of the foregoing. For example, one of the IC devices 106 may be a metal-oxide-semiconductor field-effect transistor (MOSFET) comprising a pair of source/drain regions 108 disposed in the semiconductor substrate 104, a gate dielectric 110 disposed over the semiconductor substrate 104 and between the source/drain regions 108, and a gate electrode 112 disposed over the semiconductor substrate 104 and overlying the gate dielectric 110. For readability, only one of the IC devices 106 is specifically labeled. In further embodiments, the IC structure 102 is a complementary metal-oxide-semiconductor (CMOS) structure and the IC devices 106 are part of a CMOS circuit.

The IC structure 102 comprises an interconnect structure 114, a first dielectric structure 116, and a second dielectric structure 124 disposed over the semiconductor substrate 104 and the IC devices 106. The interconnect structure 114 comprises one or more first conductive contacts 118, one or more first conductive vias 120, one or more conductive lines 122, a plurality of second conductive vias 126, and a plurality of electrodes 128. The first conductive contacts 118, the first conductive vias 120, and the conductive lines 122 are embedded in the first dielectric structure 116. The second dielectric structure 124 is disposed over the first dielectric structure 116, the first conductive contacts 118, the first conductive vias 120, and the conductive lines 122. The second conductive vias 126 and the electrodes 128 are embedded in the second dielectric structure 124. The first conductive contacts 118, the first conductive vias 120, the conductive lines 122, and the second conductive vias 126 electrically coupled the IC devices 106 to the electrodes 128. For example, the first conductive contacts 118, the first conductive vias 120, the conductive lines 122, and the second conductive vias 126 electrically coupled one or more of the IC devices 106 to a first electrode 128a of the electrodes 128, one or more of the IC devices 106 to a second electrode 128b of the electrodes 128, and/or one or more of the IC devices 106 to a third electrode 128c of the electrodes 128. For readability, only one of the first conductive contacts 118, only one of the first conductive vias 120, only one of the conductive lines 122, only one of the second conductive vias 126, and only some of the electrodes 128 are specifically labeled.

The first conductive contacts 118, the first conductive vias 120, the conductive lines 122, and/or the second conductive vias 126 may be or comprise, for example, a metal (e.g., copper (Cu), aluminum (Al), tungsten (W), or the like), polysilicon (e.g., doped polysilicon), some other conductive material, or a combination of the forgoing. The electrodes 128 may be or comprise, for example, a metal (e.g., Al, Cu, aluminum-copper (AlCu), titanium (Ti), or the like), a metal nitride (e.g., titanium nitride (TiN)), some other conductive material, or a combination of the foregoing. The first dielectric structure 116 comprises one or more stacked dielectric layers, which may respectively comprise a low-k dielectric (e.g., a dielectric material with a dielectric constant less than about 3.9), an oxide (e.g., silicon dioxide ($SiO_2$)), or the like. The second dielectric structure 124 comprises one or more stacked dielectric layers, which may respectively comprise a low-k dielectric (e.g., a dielectric material with a dielectric constant less than about 3.9), an oxide (e.g., $SiO_2$), or the like. In some embodiments, the second dielectric structure 124 comprises a single layer of $SiO_2$.

A third dielectric structure 130 is disposed over the interconnect structure 114. The third dielectric structure 130 comprises a first dielectric layer 132 and a second dielectric layer 134. The second dielectric layer 134 is disposed over the first dielectric layer 132. In some embodiments, the first dielectric layer 132 covers the electrodes 128.

The first dielectric layer 132 may be or comprise, for example, a nitride (e.g., silicon nitride (SiN)), an oxide (e.g., $SiO_2$), an oxy-nitride (e.g., silicon oxy-nitride ($SiO_xN_y$)), some other dielectric material, or a combination of the foregoing. The second dielectric layer 134 may be or comprise, for example, an oxide (e.g., $SiO_2$), a nitride (e.g., SiN), an oxy-nitride (e.g., $SiO_xN_y$), some other dielectric material, or a combination of the foregoing. In some embodiments, the first dielectric layer 132 may be a different dielectric material than the second dielectric layer 134. For example, the first dielectric layer 132 may be SiN and the second dielectric layer may be $SiO_2$. While the third dielectric structure 130 is illustrated comprising the first dielectric layer 132 and the second dielectric layer 134, it will be appreciated that the third dielectric structure 130 may comprise a single dielectric layer, or the third dielectric structure 130 may comprise any combination of any number of dielectric layers.

A microelectromechanical system (MEMS) substrate 136 is disposed over the third dielectric structure 130 and the IC structure 102. In some embodiments, the MEMS substrate 136 is disposed on the third dielectric structure 130. In further embodiments, a bond interface exists at an interface of the MEMS substrate 136 and the third dielectric structure 130. For example, in some embodiments, the MEMS substrate 136 is bonded to the third dielectric structure 130 via a bonding process (e.g., fusion bonding), thereby forming the bond interface at the interface of the MEMS substrate 136 and the third dielectric structure 130. The MEMS substrate 136 may be or comprise, for example, a semiconductor material (e.g., polysilicon, amorphous silicon, monocrystalline silicon, or the like), an oxide (e.g., $SiO_2$), some other suitable MEMS substrate, or a combination of the foregoing. In embodiments in which the MEMS substrate 136 is or comprises a semiconductor material, the semiconductor material may be doped or undoped. In yet further embodiments, the MEMS substrate 136 may be a single semiconductor material (e.g., Si, SiGe, Ge, etc.).

A third dielectric layer 138 is disposed over the MEMS substrate 136 and the third dielectric structure 130. A third conductive via 140 extends vertically through the third dielectric layer 138, the MEMS substrate 136, the third dielectric structure 130, and the second dielectric structure 124 to contact at least one of the conductive lines 122, such that the third conductive via 140 is electrically coupled to the interconnect structure 114. In some embodiments, the third conductive via 140 extends laterally over an upper surface of the third dielectric layer 138.

In some embodiments, the third conductive via 140 lines a first via opening 142 that is disposed in the third dielectric layer 138, the MEMS substrate 136, the third dielectric structure 130, and the second dielectric structure 124. The first via opening 142 extends vertically through the third dielectric layer 138, the MEMS substrate 136, the third dielectric structure 130, and the second dielectric structure 124 to expose one of the conductive lines 122. The first via opening 142 is at least partially defined by the third dielectric layer 138, the MEMS substrate 136, the third dielectric structure 130, and the one of the conductive lines 122. For example, sidewalls of the first via opening 142 are defined by first sidewalls of the third dielectric layer 138, first sidewalls of the MEMS substrate 136, first sidewalls of the third dielectric structure 130, and first sidewalls of the second dielectric structure 124, and a bottom surface of the first via opening 142 is at least partially defined by a first upper surface of the one of the conductive lines 122. In further embodiments, the first dielectric structure 116 may at least partially define the first via opening 142. For example, the bottom surface of the first via opening 142 is defined by the first upper surface of the one of the conductive lines 122 and a first upper surface of the first dielectric structure 116. It will be appreciated that the third conductive via 140 may be one of a plurality of fourth conductive vias that extend vertically through the third dielectric layer 138, the MEMS substrate 136, the third dielectric structure 130, and the second dielectric structure 124 to expose corresponding conductive lines of the conductive lines 122, and it will be appreciated that the first via opening 142 is one of a plurality of openings in which the plurality of fourth conductive vias line.

One or more second conductive contacts 144 are disposed over the MEMS substrate 136 and the third dielectric layer 138. For readability, only one of the second conductive contacts 144 are specifically labeled. In some embodiments, the one or more second conductive contacts 144 extend through the third dielectric layer 138 and contact the MEMS substrate 136. In further embodiments, the second conductive contacts 144 are electrically coupled to the MEMS substrate 136. The third conductive via 140 and the second conductive contacts 144 may be electrically coupled together. In yet further embodiments, the third conductive via 140 and the second conductive contacts 144 are parts of a conductive routing layer that continuously extends over the MEMS substrate 136.

The third dielectric layer 138 may be or comprise, for example, an oxide (e.g., $SiO_2$), a nitride (e.g., SiN), an oxy-nitride (e.g., $SiO_xN_y$), some other dielectric material, or a combination of the foregoing. The third conductive via 140 may be or comprise, for example, a metal (e.g., Al, Cu, AlCu, Ti, silver (Ag), gold (Au), or the like), a metal nitride (e.g., TiN), some other conductive material, or a combination of the foregoing. The second conductive contacts 144 may be or comprise, for example, a metal (e.g., Al, Cu, AlCu, Ti, Ag, Au, or the like), a metal nitride (e.g., TiN), some other conductive material, or a combination of the foregoing. In some embodiments, the third conductive via 140 and the second conductive contacts 144 are a same material.

The semiconductor device 100 comprises a plurality of MEMS devices 146 that are disposed over the semiconductor substrate 104 and the first dielectric structure 116. The MEMS devices 146 are laterally spaced from one another. The MEMS devices 146 comprise a plurality of cavities 148, respectively, a plurality of movable membranes 150, respectively, and the electrodes 128, respectively. The cavities 148 are laterally spaced from one another. The movable membranes 150 are laterally spaced from one another. The movable membranes 150 are portions of the MEMS substrate 136 that are configured to move (e.g., flex) in response to one or more stimuli (e.g., pressure, voltage, etc.). In some embodiments, the electrodes 128 are laterally spaced from one another. For readability, only some of the MEMS devices 146, some of the cavities 148, and some of the movable membranes 150 are specifically labeled.

For example, the MEMS devices 146 comprise a first MEMS device 146a, a second MEMS device 146b, and a third MEMS device 146c. The first MEMS device 146a is laterally spaced from the second MEMS device 146b and the third MEMS device 146c, and the second MEMS device 146b is laterally spaced from the third MEMS device 146c. The first MEMS device 146a comprises a first cavity 148a of the cavities 148, a first movable membrane 150a of the movable membranes 150, and the first electrode 128a. The second MEMS device 146b comprises a second cavity 148b of the cavities 148, a second movable membrane 150b of the movable membranes 150, and the second electrode 128b. The third MEMS device 146c comprises a third cavity 148c of the cavities 148, a third movable membrane 150c of the movable membranes 150, and the third electrode 128c. The first cavity 148a is laterally spaced from the second cavity 148b and the third cavity 148c, and the second cavity 148b is laterally spaced from the third cavity 148c. The first movable membrane 150a is laterally spaced from the second movable membrane 150b and the third movable membrane 150c, and the second movable membrane 150b is laterally spaced from the third movable membrane 150c.

A plurality of fluid communication channels 152 are disposed in the third dielectric structure 130. For readability, only some of the fluid communication channels 152 are specifically labeled. The fluid communication channels 152 extend laterally between the cavities 148, such that each of the cavities 148 are in fluid communication with one another. In some embodiments, each of the fluid communication channels 152 extend laterally between two neighboring cavities of the cavities 148, such that each of the cavities 148 are in communication with one another. Because the cavities 148 are in fluid communication with one another, cavity pressures of the cavities 148 (e.g., pressures inside the cavities 148) are substantially the same. Thus, the fluid communication channels 152 may improve device performance of the semiconductor device 100 (e.g., increased transmission/receiving sensitivity). In some embodiments, the cavity pressures of the cavities 148 refer to steady-state cavity pressures of the cavities 148, respectively (e.g., pressures inside the cavities 148 when the MEMS devices 146 are at an equilibrium state, such as when the movable membranes 150 are not actively in motion).

For example, the fluid communication channels 152 comprise a first fluid communication channel 152a and a second fluid communication channel 152b. The first fluid communication channel 152a is disposed in a first portion of the third dielectric structure 130 that is disposed laterally between the first cavity 148a and the second cavity 148b. The second fluid communication channel 152b is disposed in a second portion of the third dielectric structure 130 that is disposed laterally between the second cavity 148b and the third cavity 148c. The first fluid communication channel 152a extends laterally between the first cavity 148a and the second cavity 148b and the second fluid communication channel 152b extends laterally between the second cavity 148b and the third cavity 148c, such that the first cavity 148a, the second cavity 148b, and the third cavity 148c are in fluid communication with one another. Thus, a first cavity pressure of the first cavity 148a (e.g., a pressure inside the first cavity 148a), a second cavity pressure of the second cavity 148b, and a third cavity pressure of the third cavity 148c are substantially the same.

In some embodiments, the MEMS devices 146 are parts (e.g., elements) of a MEMS transducer 154 of the semiconductor device 100. The MEMS transducer 154 may be, for example, a MEMS ultrasonic transducer (e.g., capacitive micromachined ultrasonic transducer (CMUT), a piezoelectric micromachined ultrasonic transducer (PMUT), or the like), a MEMS pressure sensor, a MEMS microphone, a MEMS bio-sensor, a MEMS gas sensor, a MEMS infrared radiation (IR) sensor, or some other type of MEMS transducer. The fluid communication channels 152 may improve device performance of the MEMS transducer 154 (e.g., increased transmission/receiving sensitivity). It will be appreciated that, in some embodiments, the MEMS transducer 154 is one of a plurality of MEMS transducers of the semiconductor device 100.

For example, in some embodiments, the MEMS transducer 154 is a CMUT. The CMUT may operate as a transmitter by converting electrical signals into acoustic energy (e.g., ultrasonic waves), and/or the CMUT may operate as a receiver (e.g., sensor) by converting acoustic energy into electrical signals. When operating as a transmitter, the CMUT may transmit acoustic energy by applying an electrical signal (e.g., alternating current (AC) signal) across the MEMS devices 146 that causes electrostatic forces to deflect the movable membranes 150, thereby causing the movable membranes 150 to generate the acoustic energy. In some embodiments, the one or more IC devices 106 may apply the electrical signal across the MEMS devices 146 by applying the electrical signal to the electrodes 128 and the MEMS substrate 136 (e.g., via the first conductive contacts 118, the first conductive vias 120, the conductive lines 122, the second conductive vias 126, the third conductive via 140, and the second conductive contacts 144). When operating as a receiver, acoustic energy that impacts the movable membranes 150 causes the movable membranes 150 to deflect causing the MEMS devices 146 to output an electric signal (e.g., due to the deflections causing changes in the capacitances between the movable membranes 150 and the electrodes 128). In some embodiments, the one or more IC devices 106 may detect and analyze the electrical signal output by the MEMS devices 146 to derive a physical quantity associated with the amount of deflection of the movable membranes 150 (e.g., a distance between an object and the MEMS devices 146). In further embodiments, the electrodes 128 are referred to as sensing electrodes.

In some embodiments, the MEMS devices 146 of the CMUT are configured to operate in conjunction with one another (e.g., in unison). In further embodiments, during operation of the CMUT (e.g., operating as a transmitter and/or receiver), a same operating voltage may be applied to each of the MEMS devices 146. As such, differences in the cavity pressures of the MEMS devices 146 may decrease the transmission sensitivity and/or receiving sensitivity of the CMUT due to the differences in the cavity pressures causing variations in the deflections of the movable membranes 150. However, because the fluid communication channels 152 extend laterally between the cavities 148, such that each of the cavities 148 are in fluid communication with one another, the cavity pressures of the cavities 148 are substantially the same. Thus, the fluid communication channels 152 may increase the transmission sensitivity and/or receiving sensitivity of the CMUT.

It will be appreciated that, in some embodiments, the MEMS devices 146 of the CMUT comprise a plurality of electrodes (not shown), respectively, that are disposed over the MEMS substrate 136. In such embodiments, the plurality of electrodes 128 may be referred to as bottom electrodes, and the plurality of electrodes disposed over the MEMS substrate 136 may be referred to as upper electrodes. The upper electrodes overlie the bottom electrodes, respectively. In further such embodiments, the conductive routing layer may be electrically coupled to the upper electrodes, such that the CMUT may operate as a transmitter (e.g., applying the electrical signals across the MEMS devices 146 via the upper electrodes and the bottom electrodes) and/or a receiver (e.g., due to the deflections causing changes in the capacitances between the upper electrodes (or the movable membranes 150) and the bottom electrodes).

FIGS. 2A-2C illustrate various views of some embodiments of the semiconductor device 100 of FIG. 1. FIG. 2A illustrates a cross-sectional view of some embodiments of the semiconductor device 100 of FIG. 1 taken along line A-A of FIG. 2B. FIG. 2B illustrates a top-view of some embodiments of the semiconductor device 100 of FIG. 1 taken along line B-B of FIG. 2A. FIG. 2C illustrates a cross-sectional view of some embodiments of the semiconductor device 100 of FIG. 1 taken along line C-C of FIG. 2A and FIG. 2B.

As shown in FIGS. 2A-2C, the fluid communication channels 152 are at least partially defined by the third dielectric structure 130. In some embodiments, the third dielectric structure 130 at least partially defines sidewalls of the fluid communication channels 152. In further embodiments, second sidewalls of the third dielectric structure 130 at least partially define the sidewalls of the fluid communication channels 152, respectively. For example, as shown in FIGS. 2A-2C, first sidewalls of the second dielectric layer 134 define the sidewalls of the fluid communication channels 152, respectively. In yet further embodiments, the sidewalls of the fluid communication channels 152 extend vertically along substantially vertical planes that are in parallel with one another.

In some embodiments, first upper surfaces of the third dielectric structure 130 at least partially define bottom surfaces of the fluid communication channels 152, respectively. In further embodiments, first upper surfaces of the first dielectric layer 132 at least partially define the bottom surfaces of the fluid communication channels 152, respectively. For example, as shown in FIGS. 2A-2C, first upper surfaces of the first dielectric layer 132 define the bottom surfaces of the fluid communication channels 152, respectively. In further embodiments, the bottom surfaces of the fluid communication channels 152 extend laterally along substantially horizontal planes that are perpendicular to corresponding pairs of the substantially vertical planes. In yet further embodiments, the bottom surfaces of the fluid communication channels 152 are substantially co-planar.

In some embodiments, the MEMS substrate 136 at least partially defines upper surfaces of the fluid communication channels 152. In further embodiments, a first bottom surface (or first bottom surfaces) of the MEMS substrate 136 at least partially defines (or define) the upper surfaces of the fluid communication channels 152. In such embodiments, the first bottom surface (or the first bottom surfaces) of the MEMS substrate 136 extends (or are disposed) laterally between the cavities 148.

In other embodiments, the fluid communication channels 152 may tunnel through the third dielectric structure 130. In such embodiments, the upper surfaces of the fluid communication channels 152 are defined by the third dielectric structure 130. In further such embodiments, the fluid communication channels 152 may tunnel through the first dielectric layer 132 or the second dielectric layer 134, or the fluid communication channels 152 may tunnel through both the first dielectric layer 132 and the second dielectric layer 134.

The cavities 148 are at least partially defined by the third dielectric structure 130 and the MEMS substrate 136. The MEMS substrate 136 at least partially defines upper surfaces of the cavities 148. In some embodiments, a second bottom surface (or second bottom surfaces) of the MEMS substrate 136 at least partially defines (or define) the upper surfaces of the cavities 148. In further embodiments, bottom surfaces of the movable membranes 150 at least partially define the upper surfaces of the cavities 148, respectively. In yet further embodiments, the second bottom surface (or the second bottom surfaces) of the MEMS substrate 136 is substantially co-planar with the first bottom surface (or the first bottom surfaces) of the MEMS substrate 136.

The third dielectric structure 130 at least partially defines sidewalls of the cavities 148. In some embodiments, third sidewalls of the third dielectric structure 130 at least partially define sidewalls of the cavities 148, respectively. For example, as shown in FIGS. 2A-2C, second sidewalls of the second dielectric layer 134 define the sidewalls of the cavities 148, respectively.

In some embodiments, the third dielectric structure 130 at least partially defines bottom surfaces of the cavities 148, respectively. In further embodiments, second upper surfaces of the third dielectric structure 130 at least partially define the bottom surfaces of the cavities 148, respectively. For example, as shown in FIGS. 2A-2C, second upper surfaces of the first dielectric layer 132 define the bottom surfaces of the cavities 148, respectively. In yet further embodiments, the second upper surfaces of the first dielectric layer 132 and the first upper surfaces of the first dielectric layer 132 are substantially co-planar.

FIGS. 3A-3C illustrate various views of some other embodiments of the semiconductor device 100 of FIG. 1. FIG. 3A illustrates a cross-sectional view of some embodiments of the semiconductor device 100 of FIG. 1 taken along line A-A of FIG. 3B. FIG. 3B illustrates a top-view of some embodiments of the semiconductor device 100 of FIG. 1 taken along line B-B of FIG. 3A. FIG. 3C illustrates a cross-sectional view of some embodiments of the semiconductor device 100 of FIG. 1 taken along line C-C of FIG. 3A and FIG. 3B.

As shown in FIGS. 3A-3C, first upper surfaces of the second dielectric layer 134 at least partially define the bottom surfaces of the fluid communication channels 152, respectively. For example, as shown in FIGS. 3A-3C, first upper surfaces of the second dielectric layer 134 define the bottom surfaces of the fluid communication channels 152, respectively. In further embodiments, second upper surfaces of the second dielectric layer 134 may at least partially define the bottom surfaces of the cavities 148, respectively. In yet further embodiments, the second upper surfaces of the second dielectric layer 134 and the first upper surfaces of the second dielectric layer 134 are substantially co-planar.

FIGS. 4A-4C illustrate various views of some other embodiments of the semiconductor device 100 of FIG. 1. FIG. 4A illustrates a cross-sectional view of some embodiments of the semiconductor device 100 of FIG. 1 taken along line A-A of FIG. 4B. FIG. 4B illustrates a top-view of some embodiments of the semiconductor device 100 of FIG. 1 taken along line B-B of FIG. 4A. FIG. 4C illustrates a cross-sectional view of some embodiments of the semiconductor device 100 of FIG. 1 taken along line C-C of FIG. 4A and FIG. 4B.

As shown in FIGS. 4A-4C, in some embodiments, second upper surfaces of the second dielectric structure 124 at least partially define the bottom surfaces of the fluid communication channels 152, respectively. For example, as shown in FIGS. 4A-4C, the second upper surfaces of the second dielectric structure 124 define the bottom surfaces of the fluid communication channels 152, respectively. In further embodiments, second sidewalls of the second dielectric layer 134 partially define the sidewalls of the fluid communication channels 152, respectively. For example, as shown in FIGS. 4A-4C, the second sidewalls of the second dielectric layer 134 and the first sidewalls of the first dielectric layer 132 define the sidewalls of the fluid communication channels 152, respectively.

Figure 5:
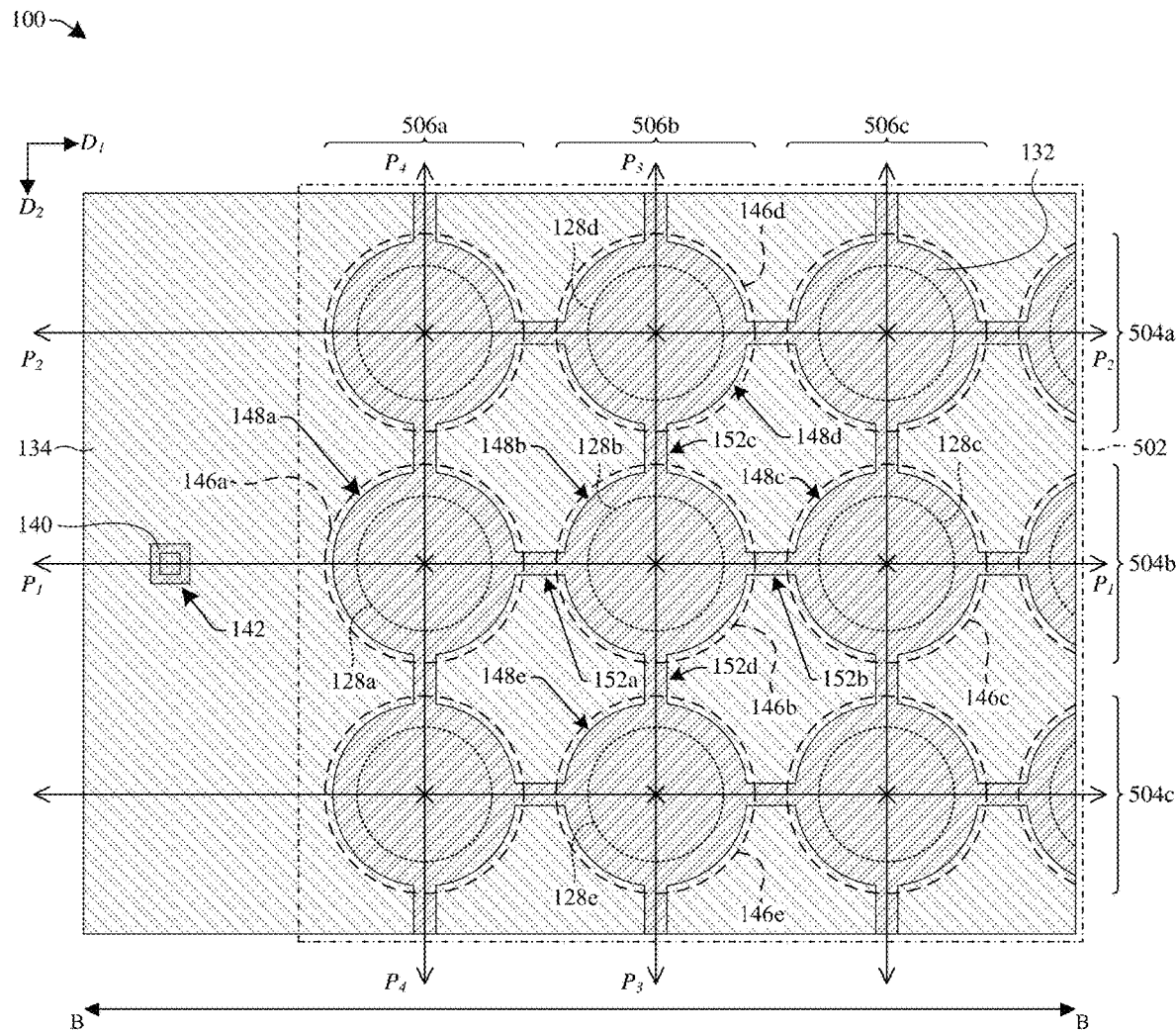
FIG. 5 illustrates a top-view of some other embodiments of the semiconductor device of FIGS. 3A-3C taken along line B-B of FIG. 3A.

FIG. 5 illustrates a top-view of some other embodiments of the semiconductor device 100 of FIGS. 3A-3C taken along line B-B of FIG. 3A.

As shown in FIG. 5, the MEMS devices 146 are disposed in a first array 502 comprising any number of rows 504 and columns 506 (e.g., 1×2 array, 2×1 array, 2×2 array, 3×3 array, etc.). For example, the first array 502 comprises a first row 504a, a second row 504b, a third row 504c, a first column 506a, a second column 506b, and a third column 506c of MEMS devices 146. The cavities 148 are disposed in a second array that corresponds to the first array. In some embodiments, the electrodes 128 are disposed in a third array that corresponds to the second array. In further embodiments, the first array 502 may be laterally spaced from the first via opening 142 in a first direction $D_1$. In other embodiments, the first via opening 142 may be disposed within outermost sides of the first array 502 and laterally spaced from the MEMS devices 146 that make up the first array 502.

The columns 506 are laterally spaced in the first direction $D_1$, and the rows 504 are laterally spaced in a second direction $D_2$ that is perpendicular to the first direction $D_1$. The MEMS devices 146 that make up each of the rows 504 are laterally spaced in the first direction $D_1$. For example, the second row 504b comprises the first MEMS device 146a, the second MEMS device 146b, and the third MEMS device 146c. The second MEMS device 146b is laterally spaced from the first MEMS device 146a in the first direction $D_1$, and the third MEMS device 146c is laterally spaced from the second MEMS device 146b in the first direction $D_1$.

The MEMS devices 146 that make up each of the columns 506 are laterally spaced in the second direction $D_2$. For example, the second column 506b comprises the second MEMS device 146b, a fourth MEMS device 146d, and a fifth MEMS device 146e. The fourth MEMS device 146d comprises a fourth cavity 148d of the cavities 148, a fourth movable membrane (not shown) of the movable membranes 150, and a fourth electrode 128d of the electrodes 128. The fifth MEMS device 146e comprises a fifth cavity 148e of the cavities 148, a fifth movable membrane (not shown) of the movable membranes 150, and a fifth electrode 128e of the electrodes 128. The fluid communication channels 152 comprise a third fluid communication channel 152c and a fourth fluid communication channel 152d. The third fluid communication channel 152c is disposed in the third dielectric structure 130 and extends laterally between the second cavity 148b and the fourth cavity 148d, and the fourth fluid communication channel 152d is disposed in the third dielectric structure 130 and extends laterally between the second cavity 148b and the fifth cavity 148e, such that the first cavity 148a, the second cavity 148b, the third cavity 148c, the fourth cavity 148d, and the fifth cavity 148e are in fluid communication with one another. The second MEMS device 146b is laterally spaced from the fourth MEMS device 146d in the second direction $D_2$, and the fifth MEMS device 146e is laterally spaced from the second MEMS device 146b in the second direction $D_2$.

Each of the cavities 148 have a center point (e.g., a geometric center when viewed along line B-B of FIG. 3A). The center point of each of the cavities 148 is illustrated by an "X" in the figures. In some embodiments, the center points of the cavities 148 of the MEMS devices 146 that make up each of the rows 504 are aligned along planes that extend laterally in the first direction $D_1$. The planes that extend laterally in the first direction $D_1$ may extend laterally in the first direction $D_1$ in substantially straight lines. The planes that extend laterally in the first direction $D_1$ may extend in parallel with one another in the first direction $D_1$.

For example, the center points of the first cavity 148a, the second cavity 148b, and the third cavity 148c are aligned along a first plane $P_1$ that extends laterally in the first direction $D_1$. In other words, the first plane $P_1$ extends laterally in the first direction $D_1$ and intersects the center points of the first cavity 148a, the second cavity 148b, and the third cavity 148c. The first plane $P_1$ extends laterally in the first direction $D_1$ in a substantially straight line. A second plane $P_2$ extends laterally in the first direction $D_1$ in a substantially straight line and in parallel with the first plane $P_1$. The second plane $P_2$ intersects the center points of the cavities 148 of the MEMS devices 146 that make up the first row 504a.

In some embodiments, the center points of the cavities 148 of the MEMS devices 146 that make up each of the columns 506 are aligned along planes that extend laterally in the second direction $D_2$. The planes that extend laterally in the second direction $D_2$ may extend laterally in the second direction $D_2$ in substantially straight lines. The planes that extend laterally in the second direction $D_2$ may extend in parallel with one another in the second direction $D_2$.

For example, the center points of the fourth cavity 148d, the second cavity 148b, and the fifth cavity 148e are aligned along a third plane $P_3$ that extends laterally in the second direction $D_2$. In other words, the third plane $P_3$ extends laterally in the second direction $D_2$ and intersects the center points of the fourth cavity 148d, the second cavity 148b, and the fifth cavity 148e. The third plane $P_3$ extends laterally in the second direction $D_2$ in a substantially straight line. A fourth plane $P_4$ extends laterally in the second direction $D_2$ in a substantially straight line and in parallel with the third plane $P_3$. The fourth plane $P_4$ intersects the center points of the cavities 148 of the MEMS devices 146 that make up the first column 506a.

Each of the fluid communication channels 152 have a center line. The center line of each of the fluid communication channels 152 is disposed an equal distance from opposite sidewalls of a corresponding one of the fluid communication channels 152. The center lines of each of the fluid communication channels 152 extend laterally in a direction that is perpendicular to the direction in which the opposite sidewalls of the corresponding one of the fluid communication channels 152 are spaced.

For example, the first fluid communication channel 152a has a first sidewall and a second sidewall that is opposite the first sidewall. The first sidewall is spaced from the second sidewall in the second direction $D_2$. A center line of the first fluid communication channel 152a extends laterally in the first direction $D_1$ and is equally spaced from the first sidewall and the second sidewall. The third fluid communication channel 152c has a third sidewall and a fourth sidewall that is opposite the third sidewall. The third sidewall is spaced from the fourth sidewall in the first direction $D_1$. The center line of the third fluid communication channel 152c extends laterally in the second direction $D_2$ and is equally spaced from the third sidewall and the fourth sidewall.

The opposite sidewalls of each of the fluid communication channels 152 extend laterally between two neighboring cavities of the cavities 148. The opposite sidewalls of the each of the fluid communication channels 152 extend laterally in the same direction as the center line of their respective fluid communication channels. In some embodiments, the opposite sidewalls of the fluid communication channels 152 extend laterally in parallel with one another. In further embodiments, the opposite sidewalls of the fluid communication channels 152 extend laterally in substantially straight lines.

For example, the first sidewall and the second sidewall of the first fluid communication channel 152a each extend laterally between the first cavity 148a and the second cavity 148b. The first sidewall and the second sidewall of the first fluid communication channel 152a extend laterally in the first direction $D_1$, which is the same as the center line of the first fluid communication channel 152a, from the first cavity 148a to the second cavity 148b. The first sidewall and the second sidewall of the first fluid communication channel 152a extend laterally in parallel with one another from the first cavity 148a to the second cavity 148b. The first sidewall and the second sidewall of the first fluid communication channel 152a each extend laterally in a substantially straight line from the first cavity 148a to the second cavity 148b. The third sidewall and the fourth sidewall of the third fluid communication channel 152c each extend laterally between the second cavity 148b and the fourth cavity 148d. The third sidewall and the fourth sidewall of the third fluid communication channel 152c extend laterally in the second direction $D_2$, which is the same as the center line of the third fluid communication channel 152c, from the fourth cavity 148d to the second cavity 148b. The third sidewall and the fourth sidewall of the third fluid communication channel 152c extend laterally in parallel with one another from the fourth cavity 148d to the second cavity 148b. The third sidewall and the fourth sidewall of the third fluid communication channel 152c each extend laterally in a substantially straight line from the fourth cavity 148d to the second cavity 148b.

In some embodiments, the center lines of the fluid communication channels 152 that extend laterally between the cavities 148 of the MEMS devices that make up each of the rows 504 are aligned along the planes that extend laterally in the first direction $D_1$. For example, the center line of the first fluid communication channel 152a and the center line of the second fluid communication channel 152b are aligned along the first plane $P_1$, and the center lines of the fluid communication channels 152 that extend laterally between the cavities 148 of the MEMS devices 146 that make up the first row 504a are aligned along the second plane $P_2$. In further embodiments, the center lines of the fluid communication channels 152 that extend laterally between the cavities 148 of the MEMS devices 146 that make up each of the columns 506 are aligned along the planes that extend laterally in the second direction $D_2$. For example, the center line of the third fluid communication channel 152c and the center line of the fourth fluid communication channel 152d are aligned along the third plane $P_3$, and the center lines of the fluid communication channels 152 that extend laterally between the cavities 148 of the MEMS devices 146 that make up the first column 506a are aligned along the fourth plane $P_4$.

In some embodiments, a center point of the first via opening 142 is aligned along one of the planes that extend in the first direction $D_1$. For example, as shown in FIG. 5, the center point of the first via opening 142 is aligned along the first plane $P_1$. In other words, the first plane $P_1$ extends in the first direction $D_1$ and intersects the center point of the first via opening 142.

In some embodiments, top-view outlines of the cavities 148 are circular-shaped, respectively, as shown in FIG. 5. In other words, when viewing the semiconductor device 100 as shown in FIG. 5, the outlines of the cavities 148 are circular-shaped, respectively. In such embodiments, sidewalls of the cavities 148 are curved. In other embodiments, the top-view outlines of the cavities 148 may be, for example, square-shaped, rectangular-shaped, hexagonal-shaped, or any other geometrical shape.

In some embodiments, top-view outlines of the movable membranes 150 are circular-shaped, respectively, as shown in FIG. 5. In other embodiments, the top-view outlines of the movable membranes 150 may be, for example, square-shaped, rectangular-shaped, hexagonal-shaped, or any other geometrical shape. In further embodiments, top-view outlines of the electrodes 128 are circular-shaped, respectively, as shown in FIG. 5. In other embodiments, the top-view outlines of the electrodes 128 may be, for example, square-shaped, rectangular-shaped, hexagonal-shaped, or any other geometrical shape.

The top-view outlines of the cavities 148, the top-view outlines of the movable membranes 150, and the top-view outlines of the electrodes 128 may have a same geometrical shape (e.g., circular-shaped), as shown in FIG. 5. In other embodiments, the top-view outlines of the cavities 148, the top-view outlines of the movable membranes 150, and the top-view outlines of the electrodes 128 may be different. For example, the top-view outlines of the cavities 148 may be different than the top-view outlines of the movable membranes 150 and/or the top-view outlines of the electrodes 128.

Each of the cavities 148 have a cavity length that is measured in the first direction $D_1$ and a cavity width that is measured in the second direction $D_2$. In embodiments in which the cavities 148 are circular-shaped, it will be appreciated that the cavity lengths and the cavity widths correspond to the diameters of the cavities 148. The fluid communication channels 152 have channel widths that correspond to a distance between the opposite sidewalls of the fluid communication channels 152, respectively. For example, a channel width of the first fluid communication channel 152a is a distance between the first sidewall and the second sidewall of the first fluid communication channel 152a. The channel widths are less than the cavity lengths or the cavity widths. In some embodiments, the channel widths are less than both the cavity lengths and the cavity widths.

The fluid communication channels 152 have channel lengths that correspond to a distance in which the fluid communication channels 152 extend laterally between two neighboring cavities of the cavities 148. For example, a channel length of the first fluid communication channel 152a is a distance in which the first fluid communication channel 152a extends laterally from the first cavity 148a to the second cavity 148b. In some embodiments, the channel lengths are less than the cavity lengths or the cavity widths. In further embodiments, the channel lengths are less than both the cavity lengths and the cavity widths. In yet further embodiments, the channel lengths are greater than the channel widths.

Figure 6:
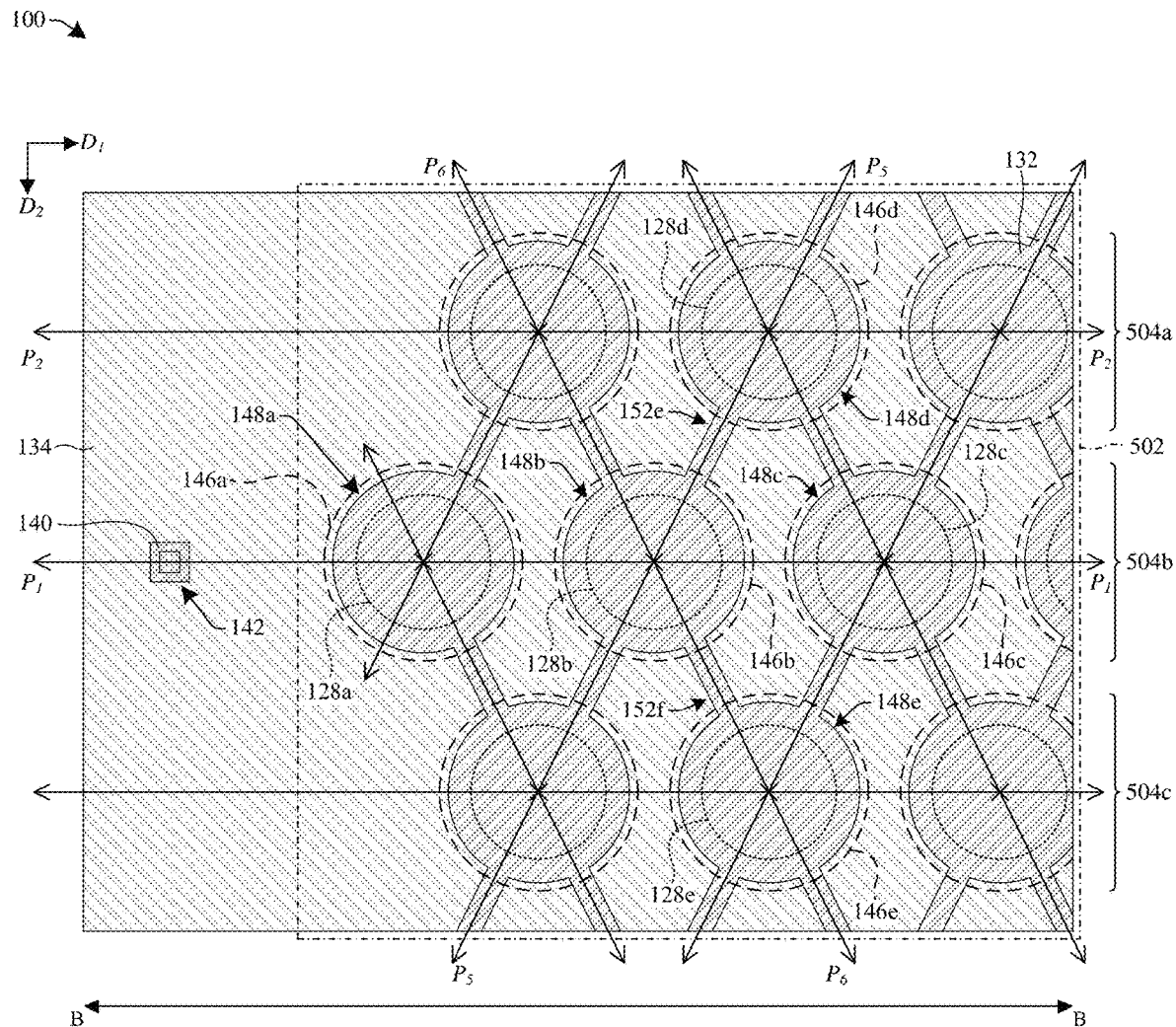
FIG. 6 illustrates a top-view of some other embodiments of the semiconductor device of FIG. 5.

FIG. 6 illustrates a top-view of some other embodiments of the semiconductor device 100 of FIG. 5.

As shown in FIG. 6, in some embodiments, the MEMS devices 146 of some of the rows 504 are shifted laterally in the first direction $D_1$ in relation to the MEMS devices 146 of some other of the rows 504. For example, the MEMS devices 146 of the first row 504a and the MEMS devices 146 of the third row 504c are shifted laterally in the first direction $D_1$ in relation to the MEMS devices 146 of the second row 504b. In such embodiments, the center lines of the fluid communication channels 152 and the center points of the cavities 148 in which such fluid communication channels laterally extend between may be aligned along planes that extend laterally in substantially straight lines. For example, a fifth fluid communication channel 152e extends laterally between the second cavity 148b and the fourth cavity 148d. The center line of the fifth fluid communication channel 152e, the center point of the second cavity 148b, and the center point of the fourth cavity 148d are aligned along a fifth plane $P_5$ that extends laterally in a substantially straight line. A sixth fluid communication channel 152f extends laterally between the second cavity 148b and the fifth cavity 148e. The center line of the sixth fluid communication channel 152f, the center point of the second cavity 148b, and the center point of the fifth cavity 148e are aligned along a sixth plane $P_6$ that extends laterally in a substantially straight line.

Figure 7:
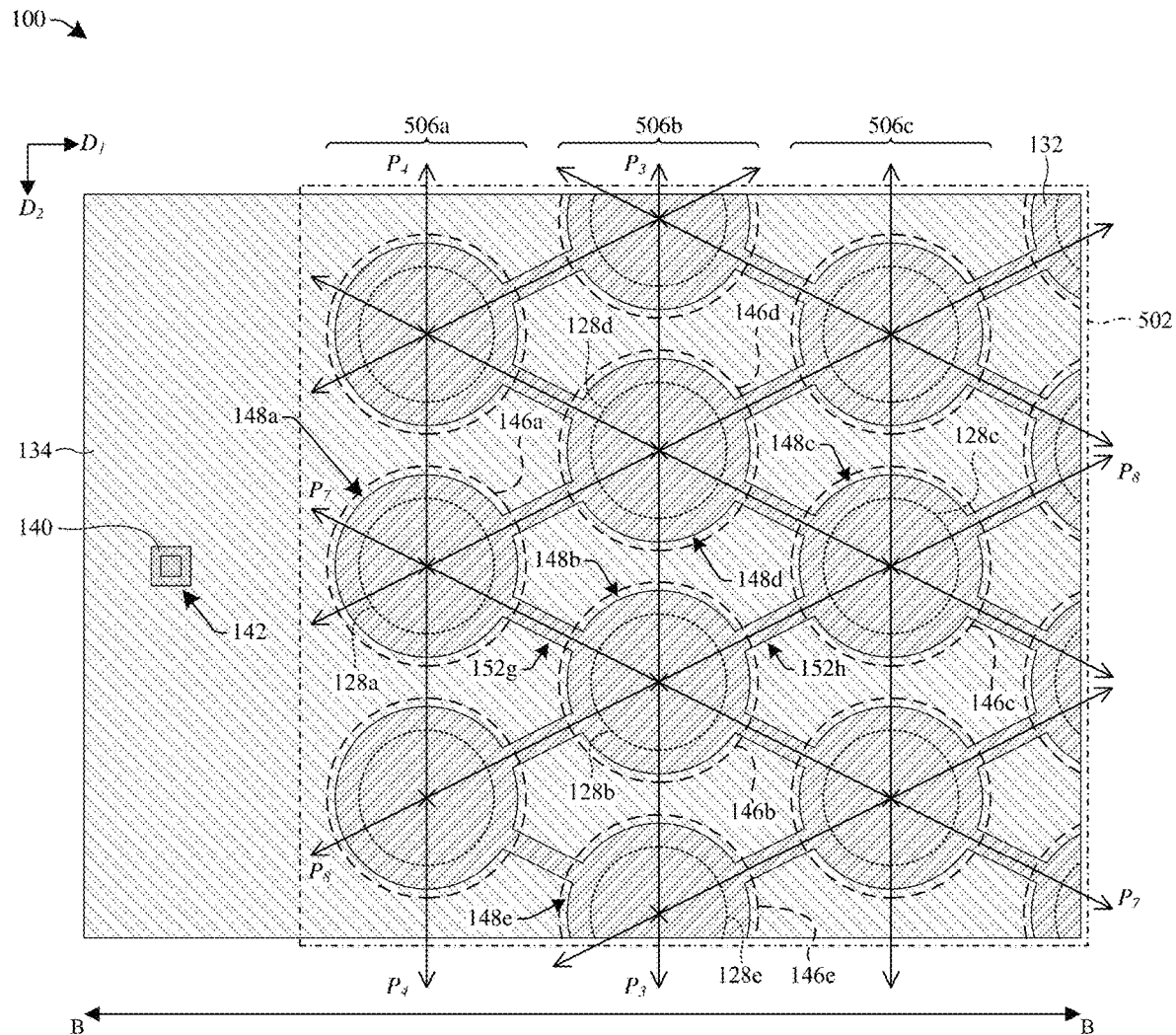
FIG. 7 illustrates a top-view of some other embodiments of the semiconductor device of FIG. 5.

FIG. 7 illustrates a top-view of some other embodiments of the semiconductor device 100 of FIG. 5.

As shown in FIG. 7, in some embodiments, the MEMS devices 146 of some of the columns 506 are shifted laterally in the second direction $D_2$ in relation to the MEMS devices 146 of some other of the columns 506. For example, the MEMS devices 146 of the second column 506*b* are shifted laterally in the second direction $D_2$ in relation to the MEMS devices 146 of the first column 506*a* and the MEMS devices 146 of the third column 506*c*. In such embodiments, the center lines of the fluid communication channels 152 and the center points of the cavities 148 in which such fluid communication channels laterally extend between may be aligned along planes that extend laterally in substantially straight lines. For example, a seventh fluid communication channel 152*g* extends laterally between the second cavity 148*b* and the first cavity 148*a*. The center line of the seventh fluid communication channel 152*g*, the center point of the second cavity 148*b*, and the center point of the first cavity 148*a* are aligned along a seventh plane $P_7$ that extends laterally in a substantially straight line. An eighth fluid communication channel 152*h* extends laterally between the second cavity 148*b* and the third cavity 148*c*. The center line of the eighth fluid communication channel 152*h*, the center point of the second cavity 148*b*, and the center point of the third cavity 148*c* are aligned along an eighth plane $P_8$ that extends laterally in a substantially straight line.

Figure 8:
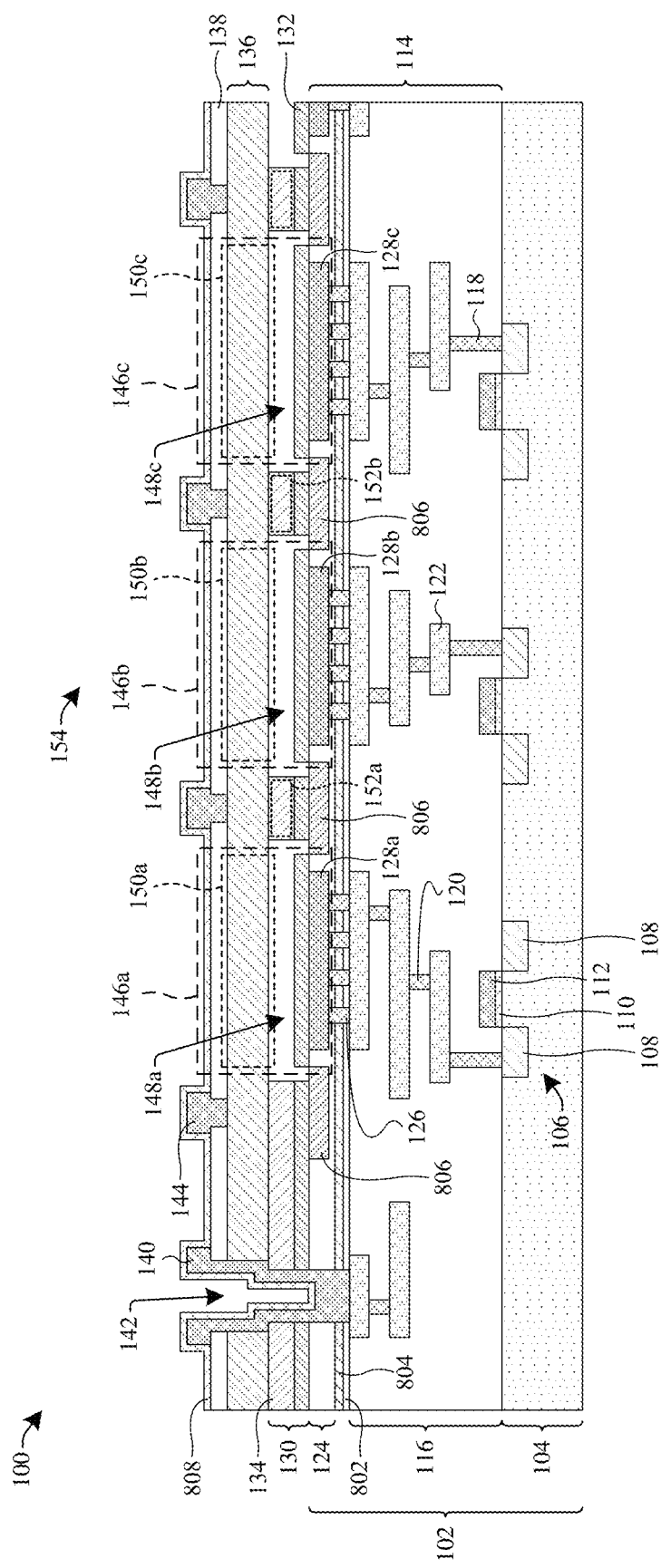
FIG. 8 illustrates a cross-sectional view of some other embodiments of the semiconductor device of FIG. 1.

FIG. 8 illustrates a cross-sectional view of some other embodiments of the semiconductor device 100 of FIG. 1.

As shown in FIG. 8, a fourth dielectric layer 802 is disposed over the first dielectric structure 116, the first conductive contacts 118, the first conductive vias 120, and the conductive lines 122. The fourth dielectric layer 802 is disposed vertically between the second dielectric structure 124 and the first dielectric structure 116. The second conductive vias 126 extend vertically through the fourth dielectric layer 802. In some embodiments, the fourth dielectric layer 802 may be or comprise, for example, a low-k dielectric (e.g., a dielectric material with a dielectric constant less than about 3.9), an oxide (e.g., silicon dioxide ($SiO_2$)), or the like.

An outgassing prevention layer 804 is disposed vertically between the fourth dielectric layer 802 and the second dielectric structure 124. The second conductive vias 126 extend vertically through the outgassing prevention layer 804. The outgassing prevention layer 804 prevents gases (e.g., oxygen, carbon dioxide, or the like) from outgassing from features of the interconnect structure 114 that are disposed below the outgassing prevention layer 804 into the cavities 148. In some embodiments, the outgassing prevention layer 804 may be or comprise, for example, a nitride (e.g., SiN), an oxy-nitride (e.g., $SiO_XN_Y$), some other outgassing prevention material, or a combination of the foregoing.

One or more gas getter structures 806 are disposed over the outgassing prevention layer 804. In some embodiments, the gas getter structures 806 are disposed in the second dielectric structure 124. The gas getter structures 806 at least partially define the cavities 148. The gas getter structures 806 are configured to absorb and/or consume gases within the cavities 148. The gas getter structures 806 may be or comprise, for example, Al, Cu, W, Ti, Au, some other suitable gas getter material, or a combination of the foregoing. For readability, only some of the gas getter structures 806 are specifically labeled.

In some embodiments, first upper surfaces of the gas getter structures 806 at least partially define first bottom surfaces of the cavities 148, respectively, and the second upper surfaces of the third dielectric structure 130 at least partially define second bottom surfaces of the cavities 148, respectively, as shown in FIG. 8. The second bottom surfaces of the cavities 148 are disposed over the first bottom surfaces of the cavities 148, respectively. The first bottom surfaces of the cavities 148 may be disposed below the bottom surfaces of the fluid communication channels 152. The second bottom surfaces of the cavities 148 may be substantially co-planar with the bottom surfaces of the fluid communication channels 152.

In some embodiments, the gas getter structures 806 are disposed directly beneath the fluid communication channels 152, respectively. The gas getter structures 806 may at least partially define the fluid communication channels 152. In further embodiments, second upper surfaces of the gas getter structures 806 at least partially define the bottom surfaces of the fluid communication channels 152.

A first passivation layer 808 is disposed over the MEMS substrate 136, the third dielectric layer 138, the third conductive via 140, and the second conductive contacts 144. In some embodiments, the first passivation layer 808 lines the third dielectric layer 138, the third conductive via 140, and the second conductive contacts 144. In further embodiments, the first passivation layer 808 may be or comprise, for example, an oxide (e.g., $SiO_2$), a nitride (e.g., SiN), an oxy-nitride (e.g., $SiO_XN_Y$), some other dielectric material, or a combination of the foregoing.

In some embodiments, the electrodes 128 may have thicknesses (e.g., a distance between an upper surface and a lower surface) between 1000 angstroms (Å) and 3000 Å, respectively. In further embodiments, a thickness of the first dielectric layer 132 may be between 20 Å and 500 Å. In further embodiments, a thickness of the second dielectric layer 134 may be between 1000 Å and 4000 Å. In yet further embodiments, a thickness of the MEMS substrate 136 may be between 4.5 micrometers (um) and 5.5 um.

Figure 9:
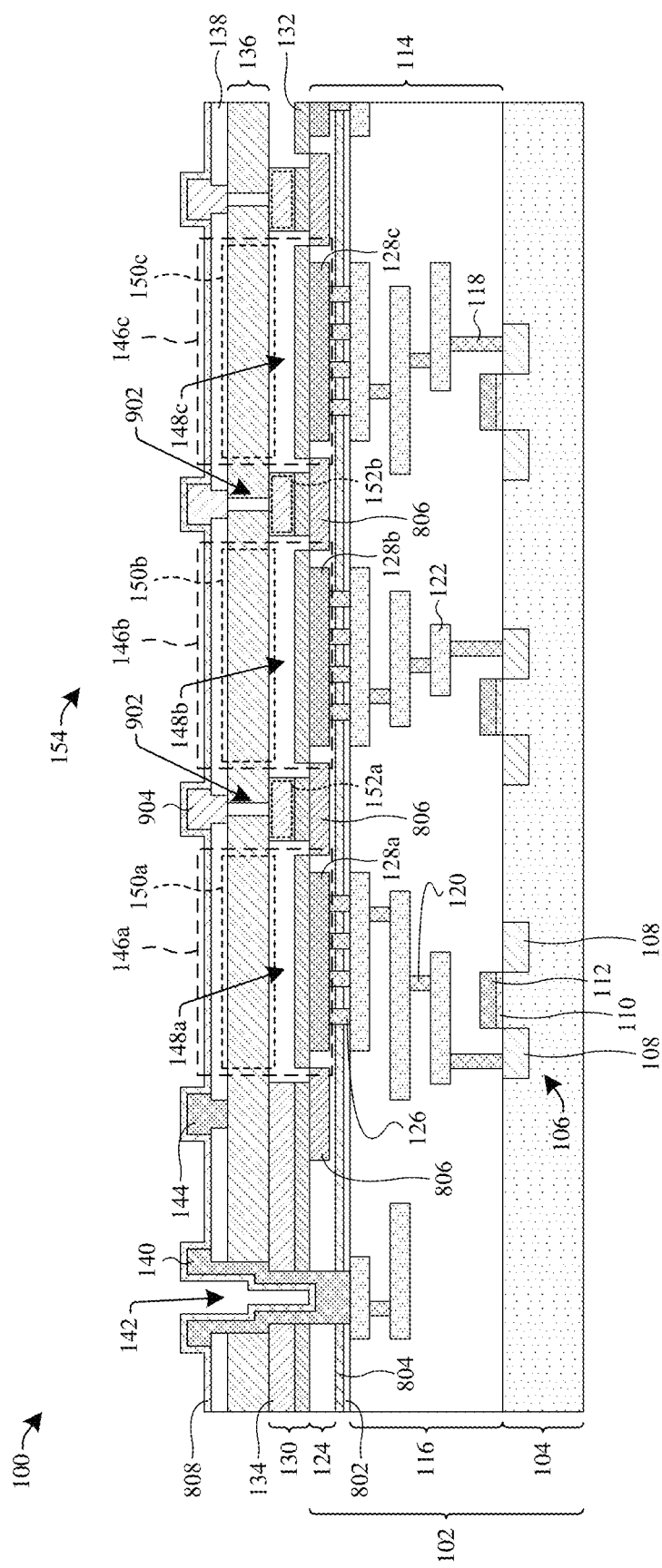
FIG. 9 illustrates a cross-sectional view of some other embodiments of the semiconductor device of FIG. 1.

FIG. 9 illustrates a cross-sectional view of some other embodiments of the semiconductor device 100 of FIG. 1.

As shown in FIG. 9, one or more vent holes 902 are disposed in the MEMS substrate 136. The vent holes 902 extend vertically through the MEMS substrate 136, such that the vent holes 902 are in fluid communication with the cavities 148 and the fluid communication channels 152. In some embodiments, the vent holes 902 extend vertically through the MEMS substrate 136 and open up into the fluid communication channels 152, respectively. In other embodiments, the vent holes 902 extend vertically through the MEMS substrate 136 and open up into the cavities 148, respectively. The vent holes 902 are at least partially defined by the MEMS substrate 136. For example, sidewalls of the vent holes 902 are at least partially defined by second sidewalls of the MEMS substrate 136. For readability, only some of the vent holes 902 are specifically labeled.

One or more plugs 904 are disposed over the MEMS substrate 136 and cover the vent holes 902. For readability, only one of the plugs 904 is specifically labeled. The plugs 904 completely cover the vent holes 902, respectively. The plugs 904 are configured to hermetically seal the cavities 148, the fluid communication channels 152, and the vent holes 902 at a reference system pressure. In some embodiments, the reference system pressure is less than or equal to 2 standard atmosphere (atm). In further embodiments, the reference system pressure may be less than 0.1 atm (e.g., for a high-vacuum MEMS transducer). In yet further embodiments, the reference system pressure may be between 0.5 atm and 2 atm (e.g., for a standard pressure MEMS transducer). In comparison to a semiconductor device 100 not comprising vent holes 902, the vent holes 902 allow the cavities 148, the fluid communication channels 152, and the vent holes 902 to be hermetically sealed at a lower reference system pressure due to the plugs 904 being able to be formed at a lower pressure than the MEMS substrate 136 can be bonded to the third dielectric structure 130. In embodiments in which the semiconductor device 100 comprises the vent holes 902 and the plugs 904, the reference system pressure may be less than 0.1 atm.

In some embodiments, the plugs 904 may be or comprise, for example, a metal (e.g., Al, Cu, AlCu, Ti, Ag, Au, or the like), a metal nitride (e.g., TiN), an oxide (e.g., $SiO_2$), a nitride (e.g., SiN), an oxy-nitride (e.g., $SiO_XN_Y$), or the like. In further embodiments, the plugs 904 may be a same material as the second conductive contacts 144. In yet further embodiments, the plugs 904 are part of the conductive routing layer that continuously extends over the MEMS substrate 136.

Figure 10:
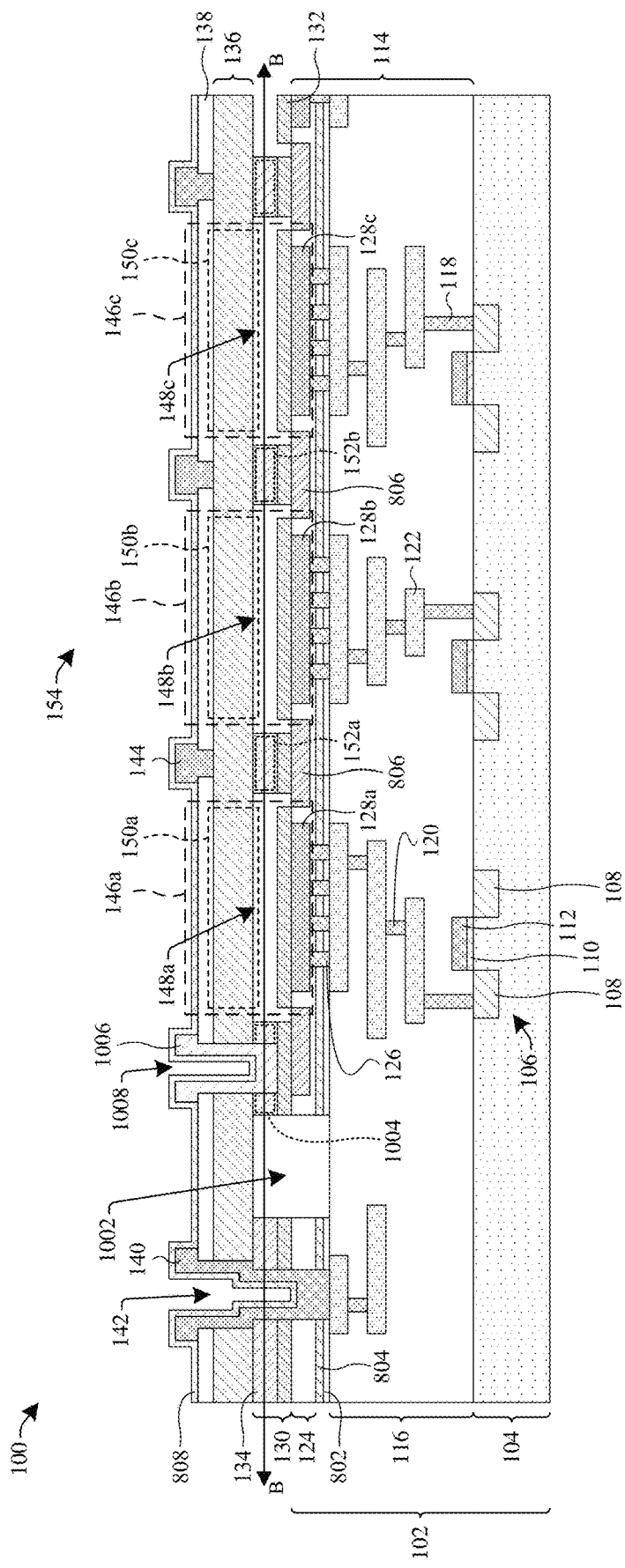
FIG. 10 illustrates a cross-sectional view of some other embodiments of the semiconductor device of FIG. 1.

FIG. 10 illustrates a cross-sectional view of some other embodiments of the semiconductor device 100 of FIG. 1.

As shown in FIG. 10, the semiconductor device 100 comprises a buffer tank 1002. The buffer tank 1002 is disposed vertically between the semiconductor substrate 104 and the MEMS substrate 136. One or more buffer tank channels 1004 are disposed in the third dielectric structure 130. The buffer tank channels 1004 extend laterally from the buffer tank 1002 to some of the cavities 148. One or more sealing structures 1006 extend vertically through the third dielectric layer 138, the MEMS substrate 136, and the third dielectric structure 130. The sealing structures 1006 completely block off the buffer tank channels 1004 to form hermetic seals between the buffer tank 1002 and the cavities 148, respectively, such that the buffer tank is not in fluid communication with the cavities 148. The sealing structures 1006 are configured to hermetically seal the cavities 148 and the fluid communication channels 152 at the reference system pressure.

In some embodiments, the sealing structures 1006 line one or more sealing structure openings 1008 that are disposed in the third dielectric layer 138 and the MEMS substrate 136. The sealing structure openings 1008 extend vertically through the third dielectric layer 138 and the MEMS substrate 136 to expose portions of the buffer tank channels 1004. The sealing structure openings 1008 are at least partially defined by the third dielectric layer 138 and the MEMS substrate 136. For example, sidewalls of the sealing structure openings 1008 are at least partially defined by second sidewalls of the third dielectric layer 138 and second sidewalls of the MEMS substrate 136. In further embodiments, the sealing structure openings 1008 are disposed in the third dielectric layer 138, the MEMS substrate 136, and the third dielectric structure 130. In yet further embodiments, the sealing structure openings 1008 are partially defined by the third dielectric structure 130. For example, the sidewalls of the sealing structure openings 1008 may be partially defined by fourth sidewalls of the third dielectric structure 130 and/or bottom surfaces of the sealing structure openings 1008 may be at least partially defined by third upper surfaces of the third dielectric structure 130.

The buffer tank 1002 is at least partially defined by the third dielectric structure 130 and the MEMS substrate 136. The MEMS substrate 136 at least partially defines an upper surfaces of the buffer tank 1002. In some embodiments, a third bottom surface of the MEMS substrate 136 at least partially defines the upper surfaces of the buffer tank 1002. In further embodiments, the third bottom surface, the second bottom surface (or the second bottom surfaces), and the first bottom surface (or the first bottom surfaces) of the MEMS substrate 136 are substantially co-planar.

The third dielectric structure 130 at least partially defines sidewalls of the buffer tank 1002. In some embodiments, the third dielectric structure 130, the second dielectric structure 124, the outgassing prevention layer 804, and the fourth dielectric layer 802 define the sidewalls of the buffer tank 1002. For example, as shown in FIG. 10, fourth sidewalls of the second dielectric layer 134, third sidewalls of the first dielectric layer 132, first sidewalls of the second dielectric structure 124, first sidewalls of the outgassing prevention layer 804, and first sidewalls of the fourth dielectric layer 802 define the sidewalls of the buffer tank 1002.

In some embodiments, the first dielectric structure 116 at least partially defines a bottom surface of the buffer tank 1002. For example, as shown in FIG. 10, a second upper surface of the first dielectric structure 116 defines the bottom surface of the buffer tank 1002. It will be appreciated that other features of the semiconductor device 100 may at least partially define the bottom surface of the buffer tank 1002 (e.g., one or more of the conductive lines 122, one or more of the gas getter structures 806, the third dielectric structure 130, the second dielectric structure 124, the outgassing prevention layer 804, the fourth dielectric layer 802, etc.).

In some embodiments, the buffer tank channels 1004 have substantially similar features (e.g., structural features) as the fluid communication channels 152. For example, the buffer tank channels 1004 are at least partially defined by the third dielectric structure 130, as are the fluid communication channels 152. In further embodiments, the buffer tank channels 1004 may extend laterally a greater distance between the buffer tank 1002 and the some of the cavities 148 than the fluid communication channels 152 extend laterally between the cavities 148. The sealing structures 1006 may be or comprise, for example, a metal (e.g., Al, Cu, AlCu, Ti, Ag, Au, or the like), a metal nitride (e.g., TiN), an oxide (e.g., $SiO_2$), a nitride (e.g., SiN), an oxy-nitride (e.g., $SiO_XN_Y$), or the like. In some embodiments, the sealing structures 1006 may comprise a same material as the second conductive contacts 144 and/or the plugs 904.

Figure 11:
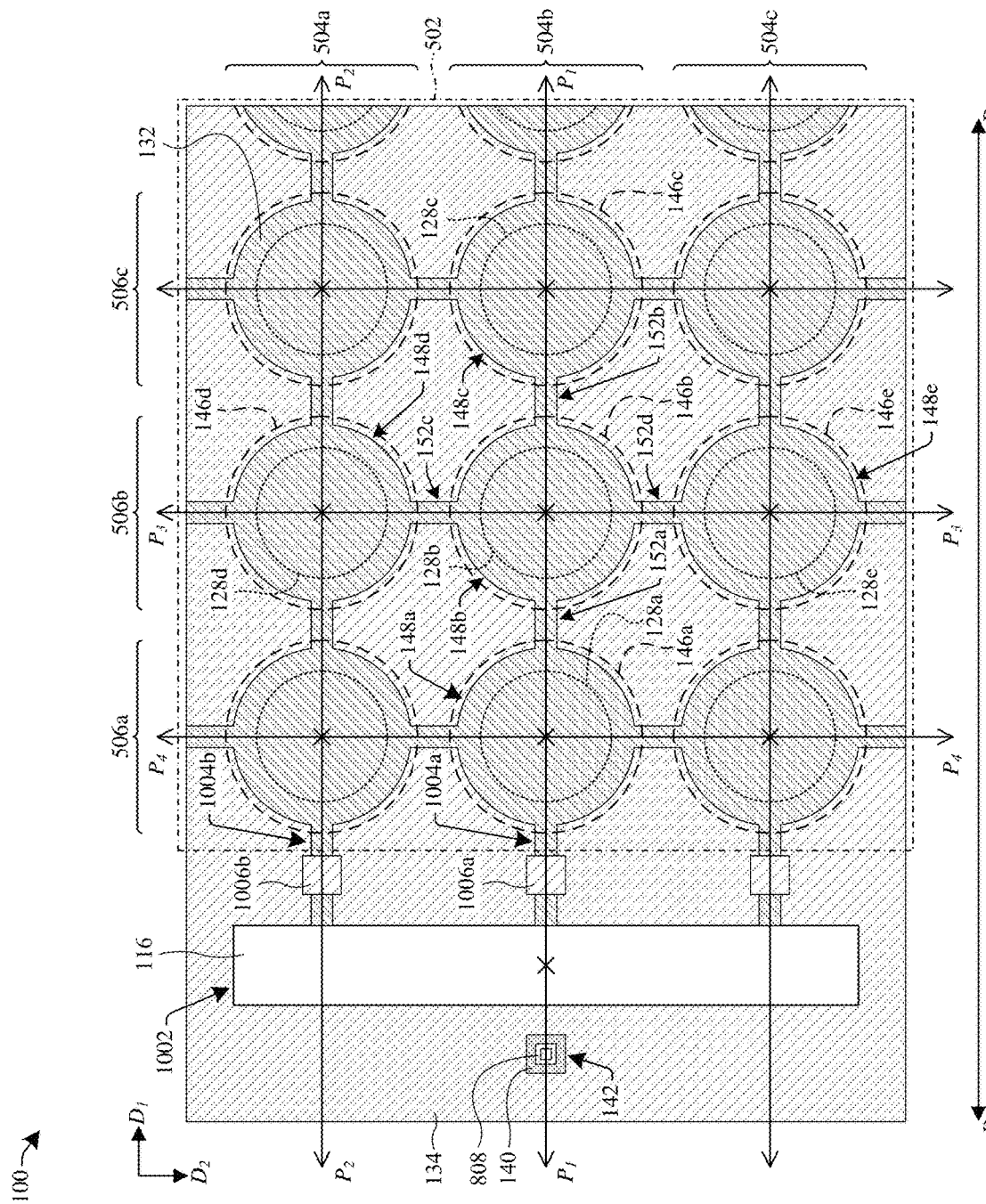
FIG. 11 illustrates a top-view of some other embodiments of the semiconductor device of FIG. 10 taken along line B-B of FIG. 10.

FIG. 11 illustrates a top-view of some other embodiments of the semiconductor device 100 of FIG. 10 taken along line B-B of FIG. 10.

As shown in FIG. 11, the MEMS devices 146 of the first array 502 are laterally spaced from the buffer tank 1002 in the first direction $D_1$. The buffer tank 1002 has a fifth sidewall and a sixth sidewall that is opposite the fifth sidewall. The sixth sidewall is laterally spaced from the fifth sidewall in the second direction $D_2$. In some embodiments, the center point of the first cavity 148a, the center point of the second cavity 148b, the center point of the third cavity 148c, the center point of the fourth cavity 148d, and/or the center point of the fifth cavity 148e are disposed laterally between the fifth sidewall and the sixth sidewall of the buffer tank 1002. In further embodiments, each of the center points of the cavities 148 are disposed laterally between the fifth sidewall and the sixth sidewall of the buffer tank 1002.

The buffer tank 1002 has a center point (e.g., a geometric center when viewed along line B-B of FIG. 11). The center point of the buffer tank 1002 is illustrated by an "X" in the figures. In some embodiments, the center point of the buffer tank 1002 is aligned along one of the planes that extend laterally in the first direction $D_1$ or one of the planes that extend laterally in the second direction $D_2$. For example, as shown in FIG. 11, the center point of the buffer tank 1002 is aligned along the first plane $P_1$. In other embodiments, the center point of the buffer tank 1002 is disposed laterally between two of the planes that extend laterally in the first direction $D_1$ or two of the planes that extend laterally in the second direction $D_2$.

The buffer tank 1002 has a first volume. The cavities 148 and the fluid communication channels 152 collectively have a second volume. In other words, the second volume is a sum of the volume of each of the cavities 148 and the volume of each of the fluid communication channels 152. In some embodiments, the first volume is less than the second volume. In further embodiments, the ratio of the first volume to the second volume is between 1:15 and 1:5.

Each of the buffer tank channels 1004 have a center line. For readability, only some of the buffer tank channels 1004 are specifically labeled. The center line of each of the buffer tank channels 1004 is disposed an equal distance from opposite sidewalls of a corresponding one of the buffer tank channels 1004. The center lines of each of the buffer tank channels 1004 extend laterally in a direction that is perpendicular to the direction in which the opposite sidewalls of the corresponding one of the buffer tank channels 1004 are spaced.

For example, the buffer tank channels 1004 comprises a first buffer tank channel 1004a. The first buffer tank channel 1004a has a seventh sidewall and an eighth sidewall that is opposite the seventh sidewall. The eighth sidewall is spaced from the seventh sidewall in the second direction $D_2$. A center line of the first buffer tank channel 1004a extends laterally in the first direction $D_1$ and is equally spaced from the seventh sidewall and the eighth sidewall.

In some embodiments, the center lines of the buffer tank channels 1004 are aligned along the planes that extend laterally in the first direction $D_1$, respectively. For example, the buffer tank channels 1004 comprises a second buffer tank channel 1004b. The center line of the first buffer tank channel 1004a is aligned along the first plane $P_1$, and the center line of the second buffer tank channel 1004b is aligned along the second plane $P_2$. In other embodiments, the center lines of the buffer tank channels 1004 are aligned along the planes that extend laterally in the second direction $D_2$, respectively.

In some embodiments, the planes that extend laterally in the first direction $D_1$ intersect the sealing structures 1006, respectively. For example, the sealing structures 1006 comprise a first sealing structure 1006a and a second sealing structure 1006b. The first plane $P_1$ intersects the first sealing structure 1006a, and the second plane $P_2$ intersects the second sealing structure 1006b. In further embodiments, the planes that extend laterally in the first direction $D_1$ intersect center points (e.g., geometric centers when viewed along line B-B of FIG. 11) of the sealing structures 1006, respectively. In other embodiments, the planes that extend laterally in the second direction $D_2$ intersect the sealing structures 1006 (or center points of the sealing structures 1006), respectively.

In some embodiments, the buffer tank channels 1004 extend laterally from the buffer tank 1002 to the cavities 148 disposed in the first column 506a, respectively. In other embodiments, the buffer tank channels 1004 extend laterally from the buffer tank 1002 to the cavities 148 disposed in the first row 504a, respectively.

Figure 12:
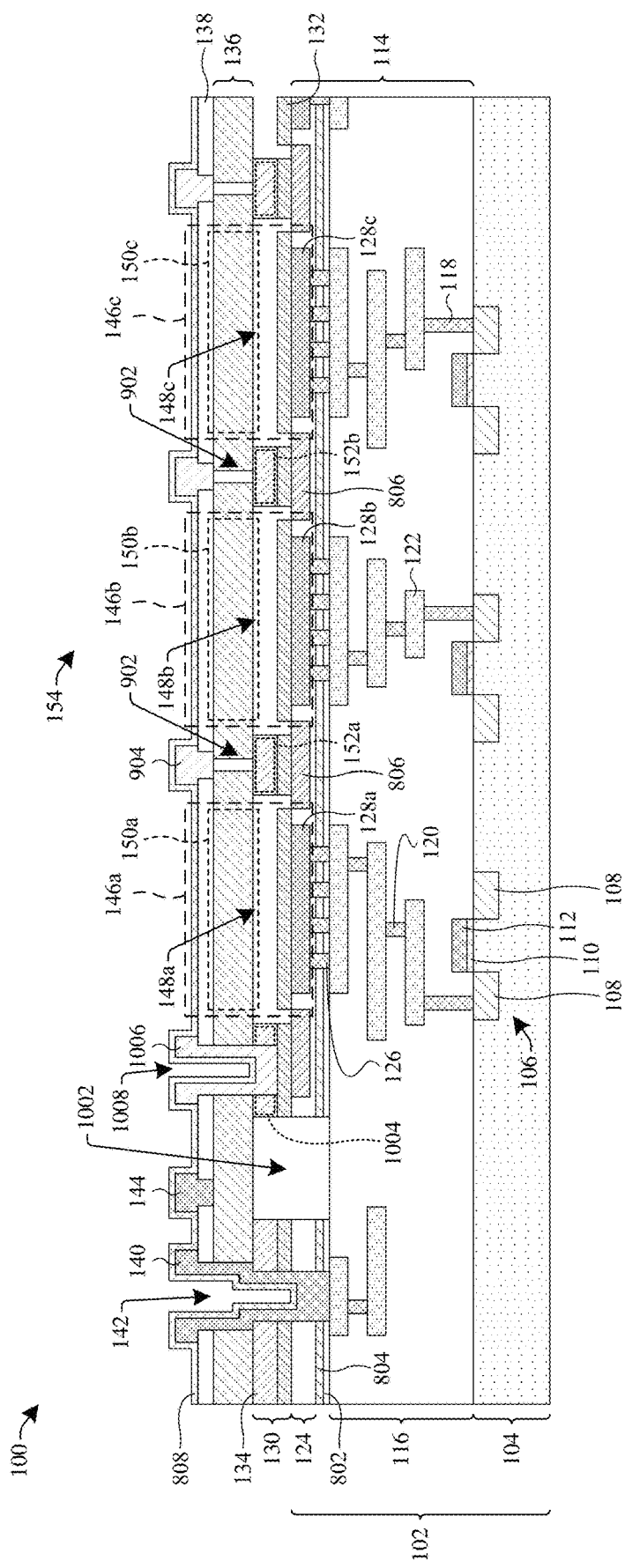
FIG. 12 illustrates a cross-sectional view of some other embodiments of the semiconductor device of FIG. 1.

FIG. 12 illustrates a cross-sectional view of some other embodiments of the semiconductor device 100 of FIG. 1.

As shown in FIG. 12, in some embodiments, the semiconductor device 100 may comprise the buffer tank 1002, the buffer tank channels 1004, the sealing structures 1006, the vent holes 902, and the plugs 904.

Figure 13:
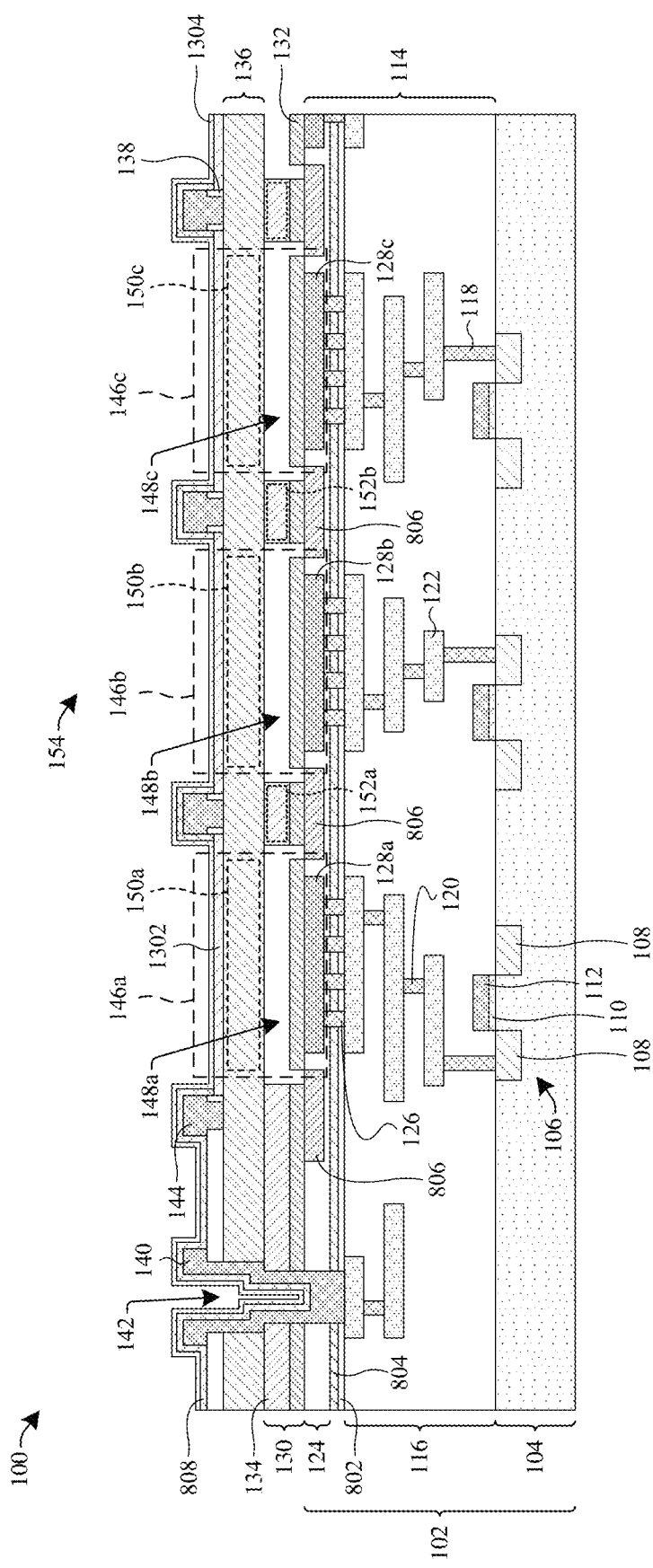
FIG. 13 illustrates a cross-sectional view of some other embodiments of the semiconductor device of FIG. 1.

FIG. 13 illustrates a cross-sectional view of some other embodiments of the semiconductor device 100 of FIG. 1.

As shown in FIG. 13, the MEMS devices 146 may comprise a plurality of MEMS functional structures 1302, respectively. For readability, only one of the MEMS functional structures 1302 are specifically labeled. The MEMS functional structures 1302 are disposed over the movable membranes 150, respectively. The MEMS functional structures 1302 overlie the electrodes 128, respectively. In some embodiments, the MEMS functional structures 1302 are laterally spaced from one another and are disposed in a fourth array that corresponds to the third array. The MEMS functional structures 1302 may be or comprise, for example, a polymer (e.g., polyimide, SU-8, or the like), a metal oxide (e.g., vanadium oxide ($VO_x$)), a piezoelectric material (e.g., lead zirconate titanate (PZT), aluminum nitride (AlN), or the like), an alloy (e.g., mercury cadmium telluride (HgCdTe), cadmium zinc telluride (CZT), or the like), a metal (e.g., Au, Ag, platinum (Pt), etc.), or the like.

The type of the MEMS transducer 154 is at least partially dependent on the chemical composition of the MEMS functional structures 1302. For example, the MEMS functional structures 1302 may comprise PZT. In such embodiments, the MEMS transducer 154 may be, for example, a PMUT. On the other hand, the MEMS functional structures 1302 may comprise $VO_x$. In such embodiments, the MEMS transducer 154 may be, for example, a MEMS-based IR sensor. It will be appreciated that the MEMS transducer 154 is not limited to the type of MEMS transducers in the above examples, but rather the MEMS transducer 154 may be any type of MEMS transducer (e.g., a MEMS pressure sensor, a MEMS bio-sensor, a MEMS gas sensor, etc.).

In some embodiments, a second passivation layer 1304 is disposed over the MEMS substrate 136, the third dielectric layer 138, the third conductive via 140, the second conductive contacts 144, the first passivation layer 808, and the MEMS functional structures 1302. In further embodiments, the second passivation layer 1304 lines the first passivation layer 808 and the MEMS functional structures 1302. In yet further embodiments, the second passivation layer 1304 may be or comprise, for example, an oxide (e.g., $SiO_2$), a nitride (e.g., SiN), an oxy-nitride (e.g., $SiO_xN_y$), some other dielectric material, or a combination of the foregoing.

FIGS. 14-22 illustrate a series of cross-sectional views of some embodiments of a method for forming some embodiments of the semiconductor device 100 of FIG. 10.

Figure 14:
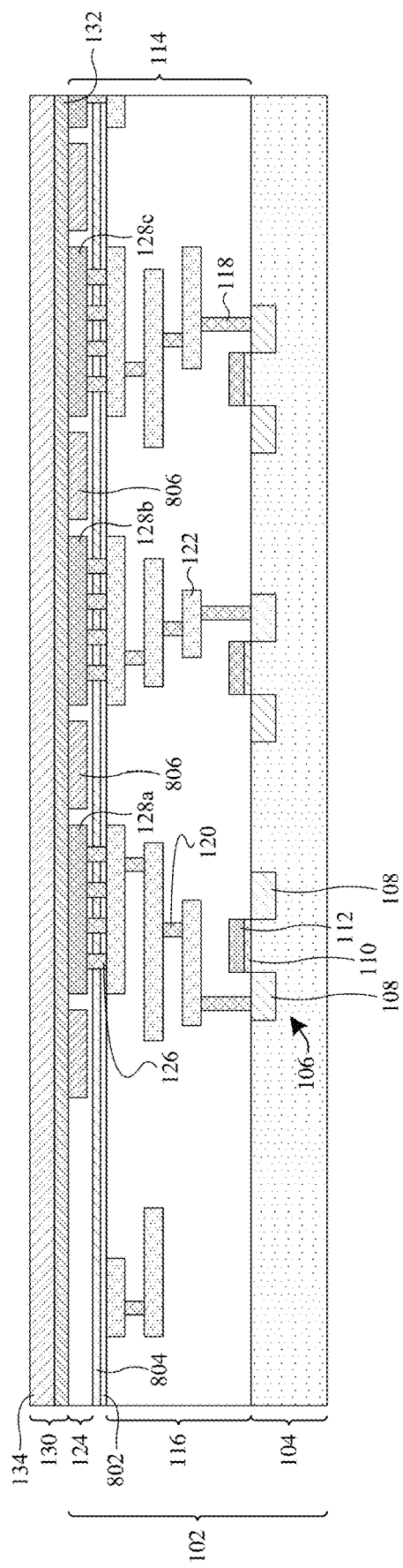
FIGS. 14-22 illustrate a series of cross-sectional views of some embodiments of a method for forming some embodiments of the semiconductor device of FIG. 10.

As shown in FIG. 14, an IC structure 102 is provided. The IC structure 102 comprises a semiconductor substrate 104. One or more IC devices 106 are formed on/over the semiconductor substrate 104. In some embodiments, one or more of the IC devices 106 comprise a pair of source/drain regions 108, a gate dielectric 110, and a gate electrode 112. A first dielectric structure 116, a fourth dielectric layer 802, an outgassing prevention layer 804, a second dielectric structure 124, an interconnect structure 114, and one or more gas getter structures 806 are formed over the semiconductor substrate 104. The interconnect structure 114 comprises one or more first conductive contacts 118, one or more first conductive vias 120, one or more conductive lines 122, a plurality of second conductive vias 126, and a plurality of electrodes 128. The IC structure 102 may be formed according to a CMOS manufacturing process.

Also shown in FIG. 14, a third dielectric structure 130 is formed over the IC structure 102. In some embodiments, the third dielectric structure 130 is formed on the second dielectric structure 124, the gas getter structures 806, and the electrodes 128. The third dielectric structure may comprise a first dielectric layer 132 and second dielectric layer 134 that is disposed over the first dielectric layer 132. In further embodiments, the first dielectric layer 132 may be formed on the second dielectric structure 124, the gas getter structures 806, and the electrodes 128. In yet further embodiments, the second dielectric layer 134 is formed on the first dielectric layer 132.

In some embodiments, a process for forming the third dielectric structure 130 comprises depositing the first dielectric layer 132 on and covering the second dielectric structure 124, the gas getter structures 806, and the electrodes 128. The first dielectric layer 132 may be deposited by, for example, chemical vapor deposition (CVD), physical vapor deposition (PVD), atomic layer deposition (ALD), some other deposition process, or a combination of the foregoing. In further embodiments, the first dielectric layer 132 may be deposited as a conformal layer having a thickness between 20 Å and 500 Å. Thereafter, the second dielectric layer 134 is deposited on the first dielectric layer 132. The second dielectric layer 134 may be deposited by, for example, CVD, PVD, ALD, some other deposition process, or a combination of the foregoing. In yet further embodiments, the second dielectric layer 134 may be deposited as a conformal layer having a thickness between 1000 Å and 4000 Å.

Figure 15:
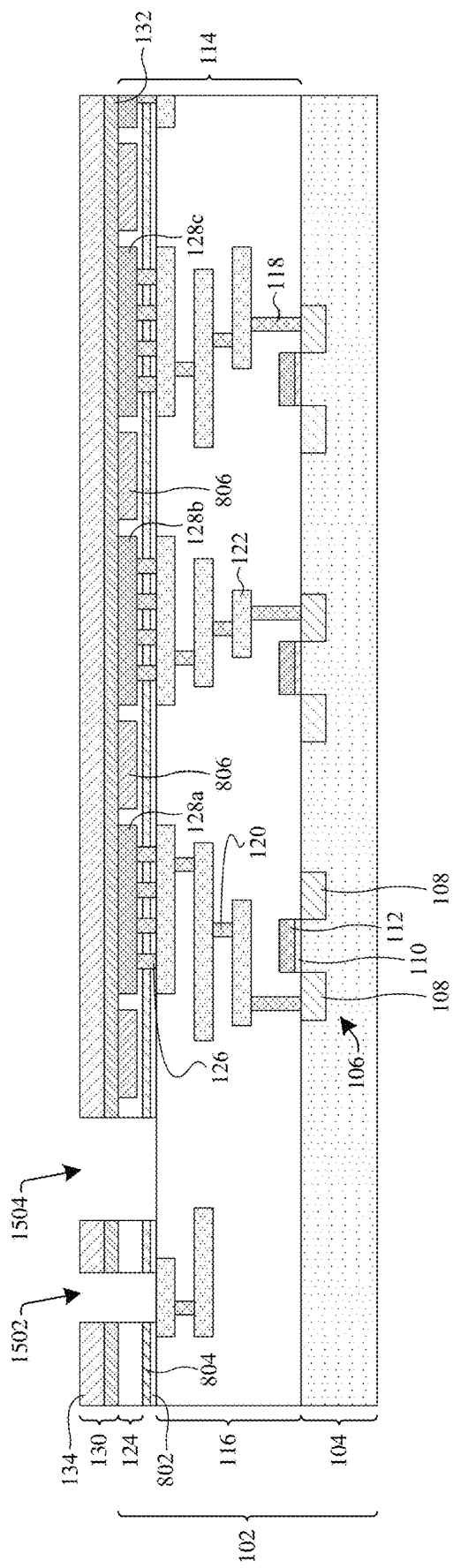

As shown in FIG. 15, a second via opening 1502 and a buffer tank opening 1504 are formed over the first dielectric structure 116. The second via opening 1502 is laterally spaced from the buffer tank opening 1504. The second via opening 1502 exposes one of the conductive lines 122.

In some embodiments, a process for forming the second via opening 1502 and the buffer tank opening 1504 comprises forming a first patterned masking layer (not shown) (e.g., positive/negative photoresist, hardmask, etc.) over the third dielectric structure 130. In further embodiments, the first patterned masking layer may be formed by forming a masking layer (not shown) on the third dielectric structure 130, exposing the masking layer to a pattern (e.g., via a lithography process, such as photolithography, extreme ultraviolet lithography, or the like), and developing the masking layer to form the first patterned masking layer. Thereafter, a first etching process is performed to remove unmasked portions of the third dielectric structure 130, the second dielectric structure 124, the outgassing prevention layer 804, and the fourth dielectric layer 802, thereby forming the second via opening 1502 and the buffer tank opening 1504 over the first dielectric structure 116. The first etching process may be a dry etching process, a wet etching process, a reactive ion etching (RIE) process, some other etching process, or a combination of the foregoing. Subsequently, in some embodiments, the first patterned masking layer is stripped away.

Figure 16:
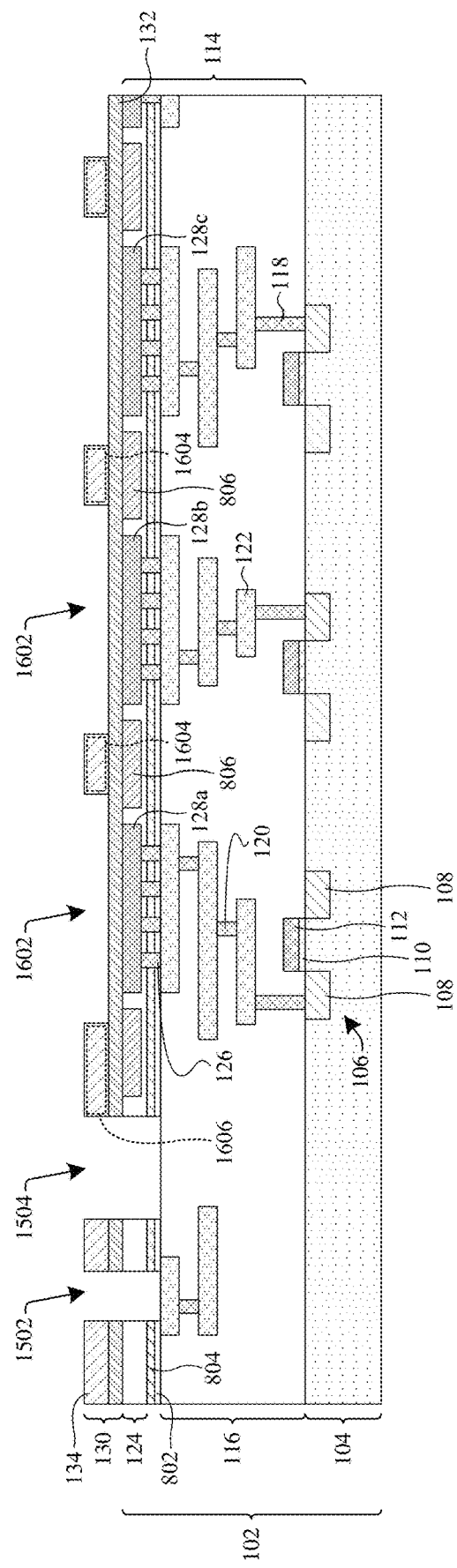

As shown in FIG. 16, a plurality of cavity openings 1602, a plurality of fluid communication channel openings 1604, and one or more buffer tank channel openings 1606 are formed over the IC structure 102. The cavity openings 1602, the fluid communication channel openings 1604, and the buffer tank channel openings 1606 are formed in the third dielectric structure 130. In some embodiments, the cavity openings 1602, the fluid communication channel openings 1604, and the buffer tank channel openings 1606 are formed over the first dielectric layer 132 and in the second dielectric layer 134. For readability, only some of the cavity openings 1602 and only some of the fluid communication channel openings 1604 are specifically labeled.

The cavity openings 1602 are formed laterally spaced from one another. In some embodiments, the electrodes 128 may be disposed in a third array. The cavity openings 1602 may be formed in a fifth array that corresponds to the third array. The fluid communication channel openings 1604 are formed extending laterally between the cavity openings 1602, such that opposite ends of the fluid communication channel openings 1604 open up into corresponding cavity openings of the cavity openings 1602. In some embodiments, each of the fluid communication channel openings 1604 are formed extending laterally between two neighboring cavity openings of the cavity openings 1602, such that the opposite ends of each of the fluid communication channel openings 1604 open up into two neighboring cavity openings of the cavity openings 1602. The buffer tank channel openings 1606 are formed extending laterally from the buffer tank opening 1504 to some of the cavity openings 1602. In some embodiments, the some of the cavity openings 1602 that the buffer tank channel openings 1606 extend to are a group of the cavity openings 1602 (e.g., a group of the cavity openings 1602 disposed in a row or column of the fifth array) that are disposed nearer the buffer tank opening 1504 than the remaining cavity openings 1602.

In some embodiments, a process for forming the cavity openings 1602, the fluid communication channel openings 1604, and the buffer tank channel openings 1606 comprises forming a second patterned masking layer (not shown) (e.g., positive/negative photoresist, hardmask, etc.) over the third dielectric structure 130, over the first dielectric structure 116, in the second via opening 1502, and in the buffer tank opening 1504. Thereafter, a second etching process is performed to remove unmasked portions of the second dielectric layer 134, thereby forming the cavity openings 1602, the fluid communication channel openings 1604, and the buffer tank channel openings 1606 over the first dielectric layer 132 and in the second dielectric layer 134. The second etching process may be a dry etching process, RIE process, a wet etching process, some other etching process, or a combination of the foregoing. Subsequently, in some embodiments, the second patterned masking layer is stripped away. In further embodiments, the cavity openings 1602 and the fluid communication channel openings 1604 are formed at the same time by the second etching process. In yet further embodiments, the cavity openings 1602, the fluid communication channel openings 1604, and the buffer tank channel openings 1606 are formed at the same time by the second etching process.

Figure 17:
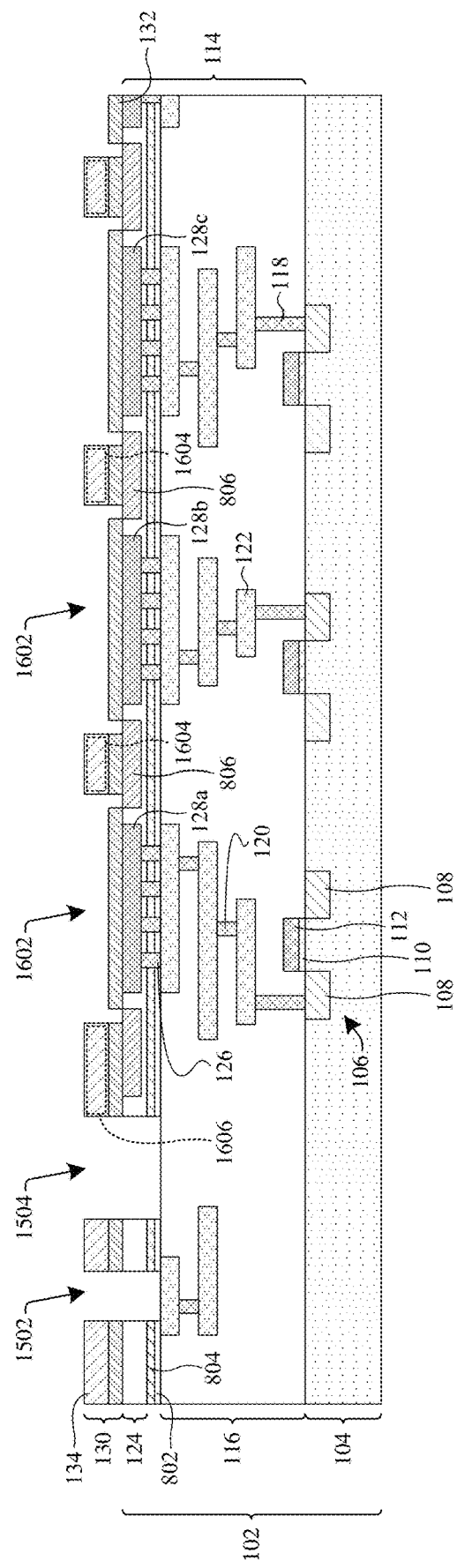

As shown in FIG. 17, portions of the first dielectric layer 132 are removed to at least partially expose the gas getter structures 806. In some embodiments, a process for removing the portions of the first dielectric layer 132 to at least partially expose the gas getter structures 806 comprises forming a third patterned masking layer (not shown) (e.g., positive/negative photoresist, hardmask, etc.) over the third dielectric structure 130, over the first dielectric structure 116, in the second via opening 1502, in the buffer tank opening 1504, in the cavity openings 1602, in the fluid communication channel openings 1604, and in the buffer tank channel openings 1606. Thereafter, a third etching process is performed to remove unmasked portions of the first dielectric layer 132, thereby removing the portions of the first dielectric layer 132 to at least partially expose the gas getter structures 806. The third etching process may be a dry etching process, RIE process, a wet etching process, some other etching process, or a combination of the foregoing. Subsequently, in some embodiments, the third patterned masking layer is stripped away.

Figure 18:
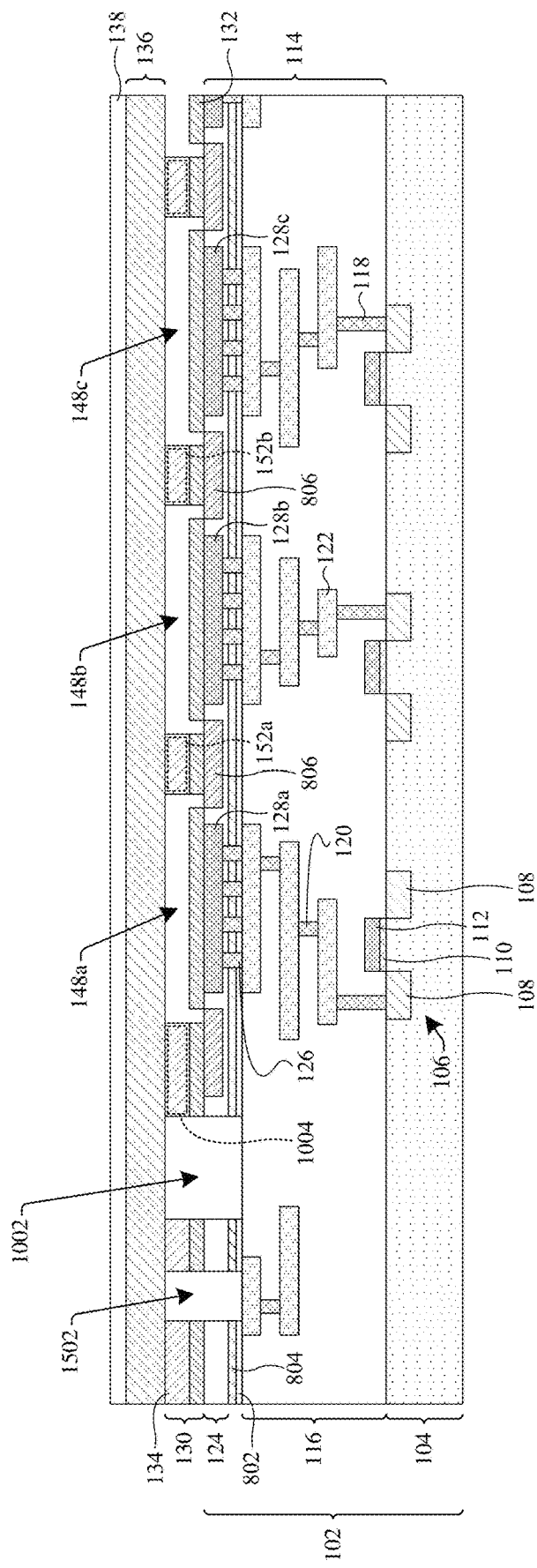

As shown in FIG. 18, a MEMS substrate 136 is bonded to the third dielectric structure 130. The MEMS substrate 136 may be bonded to the second dielectric layer 134. In some embodiments, the MEMS substrate 136 is bonded to the third dielectric structure 130 via a fusion bonding process. By bonding the MEMS substrate 136 to the third dielectric structure 130, a plurality of cavities 148, a buffer tank 1002, a plurality of fluid communication channels 152, and one or more buffer tank channels 1004 are formed over the IC structure 102. For example, once the MEMS substrate 136 is bonded to the third dielectric structure 130, the MEMS substrate 136 completely covers the buffer tank opening 1504, the cavity openings 1602, the fluid communication channel openings 1604, and the buffer tank channel openings 1606 (see, e.g., FIG. 17), thereby forming the buffer tank 1002, the cavities 148, the plurality of fluid communication channels 152, and the one or more buffer tank channels 1004, respectively.

In some embodiments, a third dielectric layer 138 is disposed over a side of the MEMS substrate 136 that is opposite the side of the MEMS substrate 136 that is bonded to the third dielectric structure 130. The third dielectric layer 138 may be disposed over the side of the MEMS substrate 136 that is opposite the side of the MEMS substrate 136 that is bonded to the third dielectric structure 130 before the MEMS substrate 136 is bonded to the third dielectric structure 130. In other embodiments, the third dielectric layer 138 may be formed over the MEMS substrate 136 and the IC structure 102 after the MEMS substrate 136 is bonded to the third dielectric layer 138. In further embodiments, a process for forming the third dielectric layer 138 over the MEMS substrate 136 and the IC structure 102 comprises depositing or growing the third dielectric layer 138 on the MEMS substrate 136 by, for example, CVD, PVD, ALD, thermal oxidation, some other deposition or growth process, or a combination of the foregoing.

In embodiments in which the semiconductor device 100 does not comprise the buffer tank 1002 and/or one or more vent holes 902 (see, e.g., FIG. 9), bonding the MEMS substrate 136 to the third dielectric structure 130 hermetically seals the cavities 148 and the fluid communication channels 152 at a reference system pressure (e.g., less than or equal to 2 atm). In such embodiments, the reference system pressure may be between 0.5 atm and 2 atm (e.g., for a standard pressure MEMS transducer). In further such embodiments, a process for bonding the MEMS substrate 136 to the third dielectric structure 130 comprises placing the structure illustrated in FIG. 17 into a processing chamber, pumping down the processing chamber so that a fluid (e.g., gas) in the processing chamber is at a predefined pressure (e.g., less than or equal to 2 atm), and bonding the MEMS substrate 136 to the third dielectric structure 130 while the fluid in the processing chamber is at the predefined pressure, thereby hermetically sealing the cavities 148 and the fluid communication channels 152 at the reference system pressure.

Figure 19:
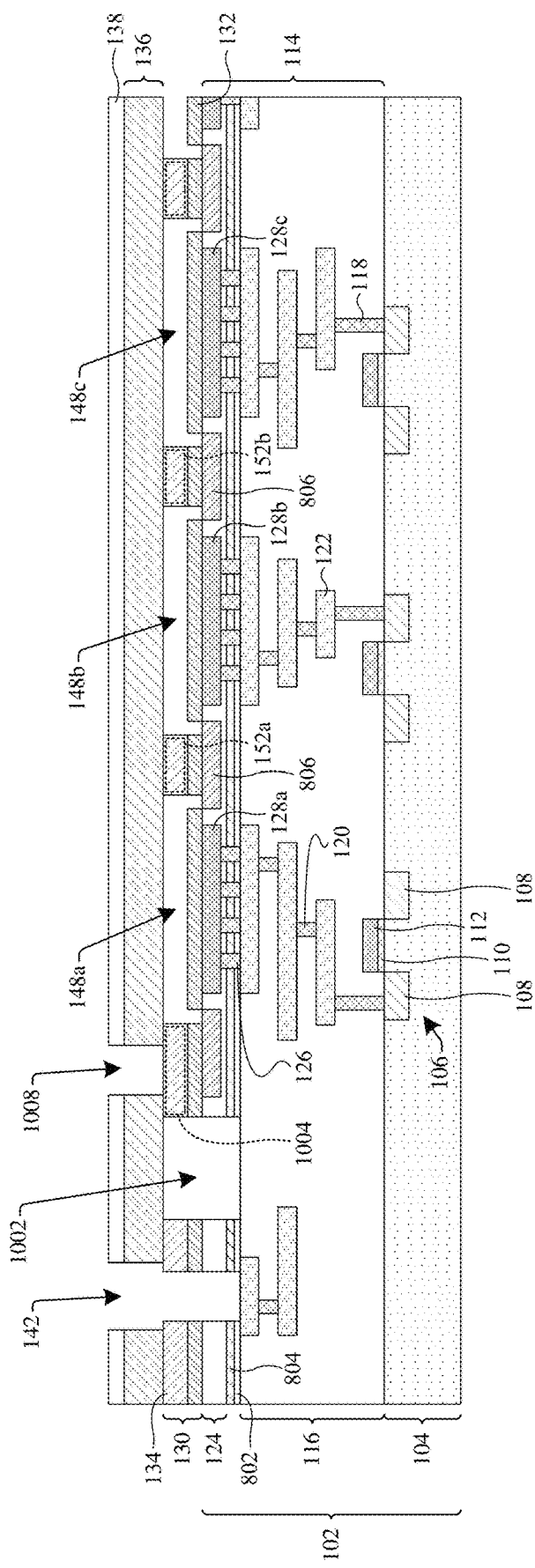

As shown in FIG. 19, one or more sealing structure openings 1008 are formed extending vertically through the MEMS substrate 136 and the third dielectric layer 138. The sealing structure openings 1008 expose portions of the buffer tank channels 1004. Further, a first via opening 142 is formed extending vertically through the third dielectric layer 138, the MEMS substrate 136, the third dielectric structure 130, and the second dielectric structure 124. The first via opening 142 exposes one of the conductive lines 122.

In some embodiments, a process for forming the sealing structure openings 1008 and the first via opening 142 comprises forming a fourth patterned masking layer (not shown) (e.g., positive/negative photoresist, hardmask, etc.) over the third dielectric layer 138. Thereafter, a fourth etching process is performed to remove unmasked portions of the third dielectric layer 138 and the MEMS substrate 136, thereby forming the sealing structure openings 1008 and the first via opening 142. The unmasked portions of the third dielectric layer 138 and the MEMS substrate 136 that are removed to form the first via opening 142 overlie the second via opening 1502 (see, e.g., FIG. 18). In other words, the second via opening 1502 is exposed by removing the unmasked portions of the third dielectric layer 138 and the MEMS substrate 136, thereby forming the first via opening 142. Subsequently, in some embodiments, the fourth patterned masking layer may be stripped away. It will be appreciated that, in some embodiments, the fourth etching process may form one or more vent holes 902 (see, e.g., FIG. 9) extending vertically through the MEMS substrate 136.

Figure 20:
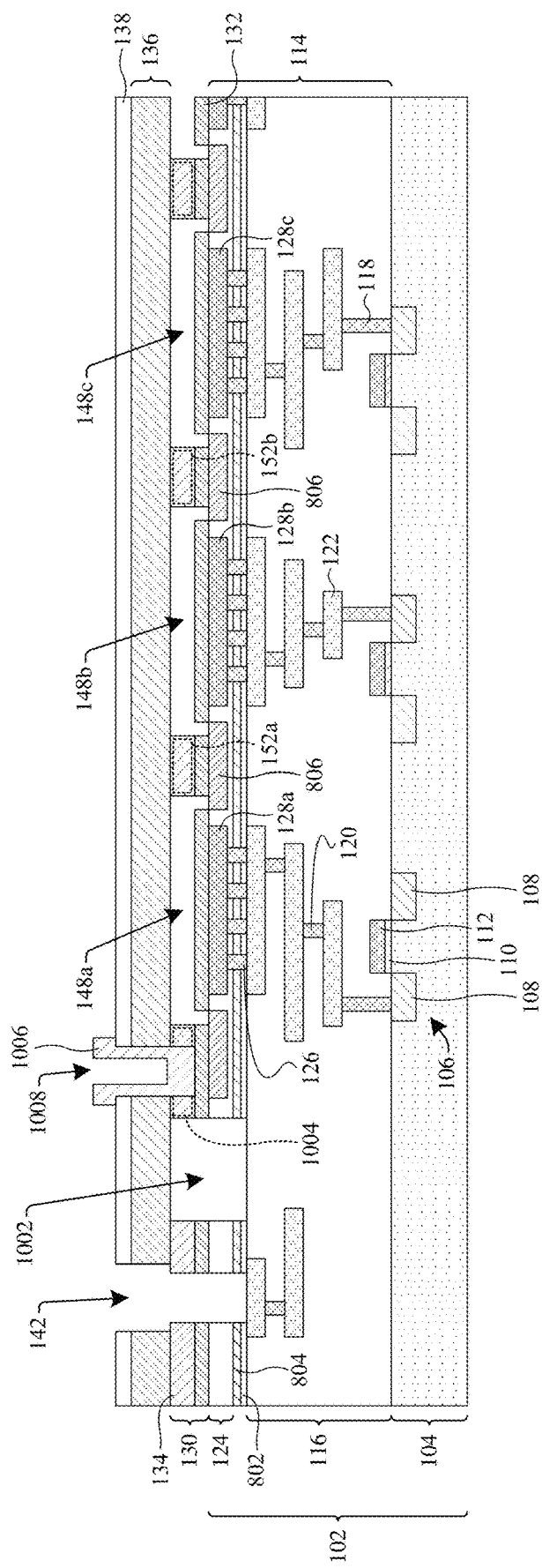

As shown in FIG. 20, one or more sealing structures 1006 are formed over the IC structure 102 and extending vertically through the third dielectric layer 138, the MEMS substrate 136, and the third dielectric structure 130. The sealing structures 1006 are formed lining the sealing structure openings 1008, respectively. The sealing structures 1006 are formed in the buffer tank channels 1004, respectively. The sealing structures 1006 are formed completely blocking off the buffer tank channels 1004 between the buffer tank 1002 and the cavities 148, respectively. The sealing structures 1006 form hermetic seals between the buffer tank 1002 and the cavities 148, respectively, such that the buffer tank is not in fluid communication with the cavities 148. Further, the sealing structures 1006 hermetically seal the cavities 148 and the fluid communication channels 152 at the reference system pressure.

In some embodiments, a process for forming the sealing structures 1006 comprises placing the structure illustrated in FIG. 19 into a processing chamber. The processing chamber is then pumped down so that a fluid (e.g., gas) in the processing chamber is at a predefined pressure (e.g., less than or equal to 2 atm). While the fluid in the processing chamber is at the predefined pressure, a sealing layer (not shown) is deposited over the third dielectric layer 138, in the first via opening 142, in the sealing structure openings 1008, and in the buffer tank channels 1004. By depositing the sealing layer in the processing chamber while the fluid in the processing chamber is at the predefined pressure, the sealing structures 1006 hermetically seals the cavities 148 and the fluid communication channels 152 at the reference system pressure. The sealing layer may be or comprise, for example, a metal (e.g., Al, Cu, AlCu, Ti, Ag, Au, or the like), a metal nitride (e.g., TiN), an oxide (e.g., $SiO_2$), a nitride (e.g., SiN), an oxy-nitride (e.g., $SiO_xN_y$), or the like. The sealing layer may be deposited by, for example, CVD, PVD, ALD, electroless plating, electrochemical plating, some other deposition process, or a combination of the foregoing.

Thereafter, a fifth patterned masking layer (not shown) (e.g., positive/negative photoresist, hardmask, etc.) is formed on the sealing layer. A fifth etching process is then performed on the sealing layer to remove unmasked portions of the sealing layer, thereby forming the sealing structures 1006. Subsequently, in some embodiments, the fifth patterned masking layer is stripped away. It will be appreciated that, in some embodiments, the fifth patterned masking layer may be formed before the sealing layer is deposited. In such embodiments, after the sealing layer is deposited, a planarization process (e.g., chemical-mechanical polishing (CMP)) may be performed on the sealing layer, thereby forming the sealing structures 1006. In embodiments in which the vent holes 902 (see, e.g., FIG. 9) are disposed in the MEMS substrate 136, one or more plugs 904 (see, e.g., FIG. 9) may be formed over the MEMS substrate 136 and over the third dielectric layer 138 to seal off the vent holes 902. In some embodiments, the sealing structures 1006 and the plugs 904 may be formed at a same time by a same deposition process.

In comparison to if the structure in FIG. 20 did not comprise a buffer tank, the buffer tank 1002 and the buffer tank channels 1004 may allow the cavities 148 and the fluid communication channels 152 (and the vent holes 902) to be hermetically sealed at a lower reference system pressure. In such embodiments, the reference system pressure may be less than 0.1 atm (e.g., for a high-vacuum MEMS transducer). For example, before the sealing structures 1006 are formed, the buffer tank 1002 is in fluid communication with the cavities 148 because the buffer tank channels 1004 extend laterally between the buffer tank 1002 and the some of the cavities 148. Thus, before the sealing structures 1006 are formed, the buffer tank 1002 and the cavities 148 collectively have a third volume. In other words, the third volume is the sum of the volume of the buffer tank 1002 and the volume of each of the cavities 148. The third volume is greater than the sum of the volume of each of the cavities 148. Accordingly, in comparison to if the structure in FIG. 20 did not comprise a buffer tank, the buffer tank 1002 and the buffer tank channels 1004 allow the cavities 148 and the fluid communication channels 152 (and the vent holes 902) to be hermetically sealed at the lower reference system pressure (e.g., due to pressure being dependent on volume).

Figure 21:
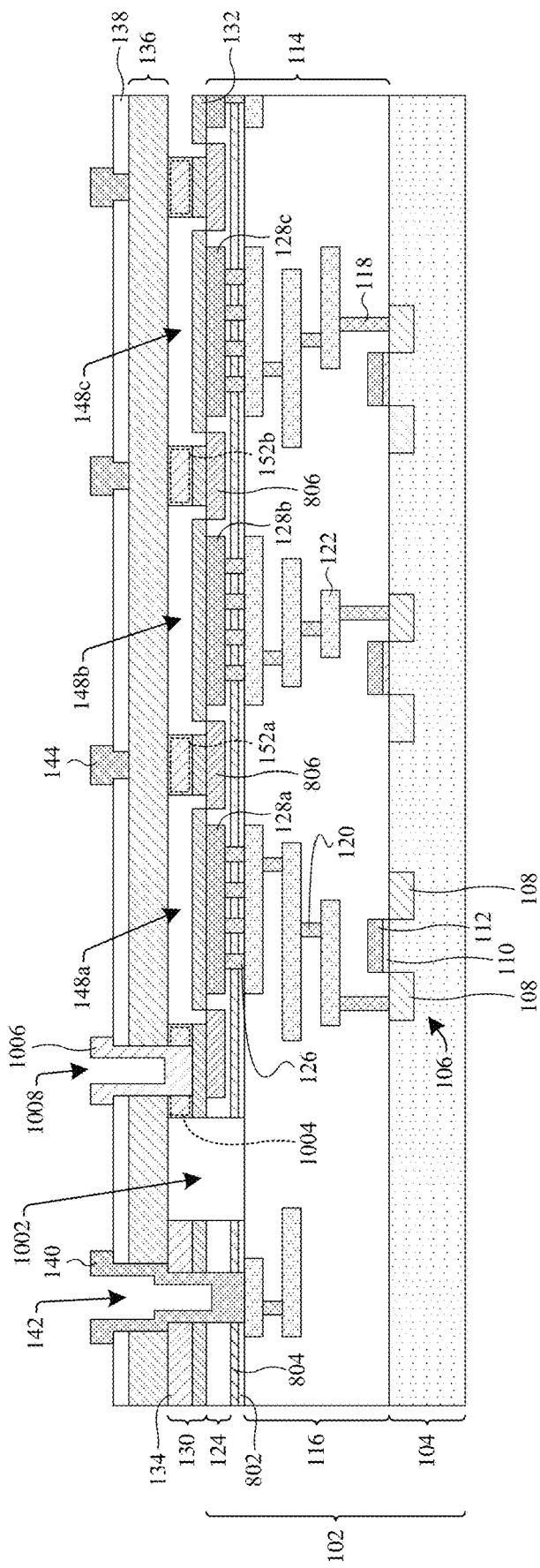

As shown in FIG. 21, a third conductive via 140 and one or more second conductive contacts 144 are formed over the MEMS substrate 136. The third conductive via 140 is formed extending vertically through the third dielectric layer 138, the MEMS substrate 136, the third dielectric structure 130, and the second dielectric structure 124 to contact a corresponding one of the conductive lines 122. The one or more second conductive contacts 144 are formed extending through the third dielectric layer 138 and contacting the MEMS substrate 136.

In some embodiments, a process for forming the third conductive via 140 and the second conductive contacts 144 comprises forming a sixth patterned masking layer (not shown) (e.g., positive/negative photoresist, hardmask, etc.) over the third dielectric layer 138, over the first dielectric structure 116, over the sealing structures 1006, and in the first via opening 142. Thereafter, a sixth etching process (e.g., wet etch, dry etch, RIE, etc.) is performed on the third dielectric layer 138, thereby forming conductive contact opening (and/or trenches) (not shown) in the third dielectric layer 138 that correspond to the second conductive contacts 144. Subsequently, in some embodiments, the sixth patterned masking layer is stripped away.

Thereafter, a conductive layer (not shown) is deposited over the third dielectric layer 138, over the first dielectric structure 116, over the sealing structures 1006, in the first via opening 142, and in the conductive contact opening (and/or trenches). The conductive layer may be, for example, a metal (e.g., Al, Cu, AlCu, Ti, Ag, Au, or the like), a metal nitride (e.g., TiN), some other conductive material, or a combination of the foregoing. The conductive layer may be deposited by, for example, CVD, PVD, ALD, electroless plating, electrochemical plating, some other deposition process, or a combination of the foregoing. A seventh patterned masking layer (not shown) (e.g., positive/negative photoresist, hardmask, etc.) is then formed over the conductive layer. A seventh etching process is then performed on the conductive layer to remove unmasked portions of the conductive layer, thereby forming the third conductive via 140 and the second conductive contacts 144. Subsequently, in some embodiments, the seventh patterned masking layer is stripped away.

It will be appreciated that, in some embodiments, rather than performing the seventh etching process, a planarization process (e.g., CMP) may be performed on the conductive layer, thereby forming the third conductive via 140 and the second conductive contacts 144. It will further be appreciated that, in some embodiments, the seventh patterned masking layer may be formed before the conductive layer is deposited. In such embodiments, after the conductive layer is deposited, a planarization process (e.g., CMP) may be performed on the conductive layer, thereby forming the third conductive via 140 and the second conductive contacts 144. It will further be appreciated that, in some embodiments, the third conductive via 140, the second conductive contacts 144, the sealing structures 1006, and the second conductive contacts 144 may be formed at the same time by a same deposition process.

Figure 22:
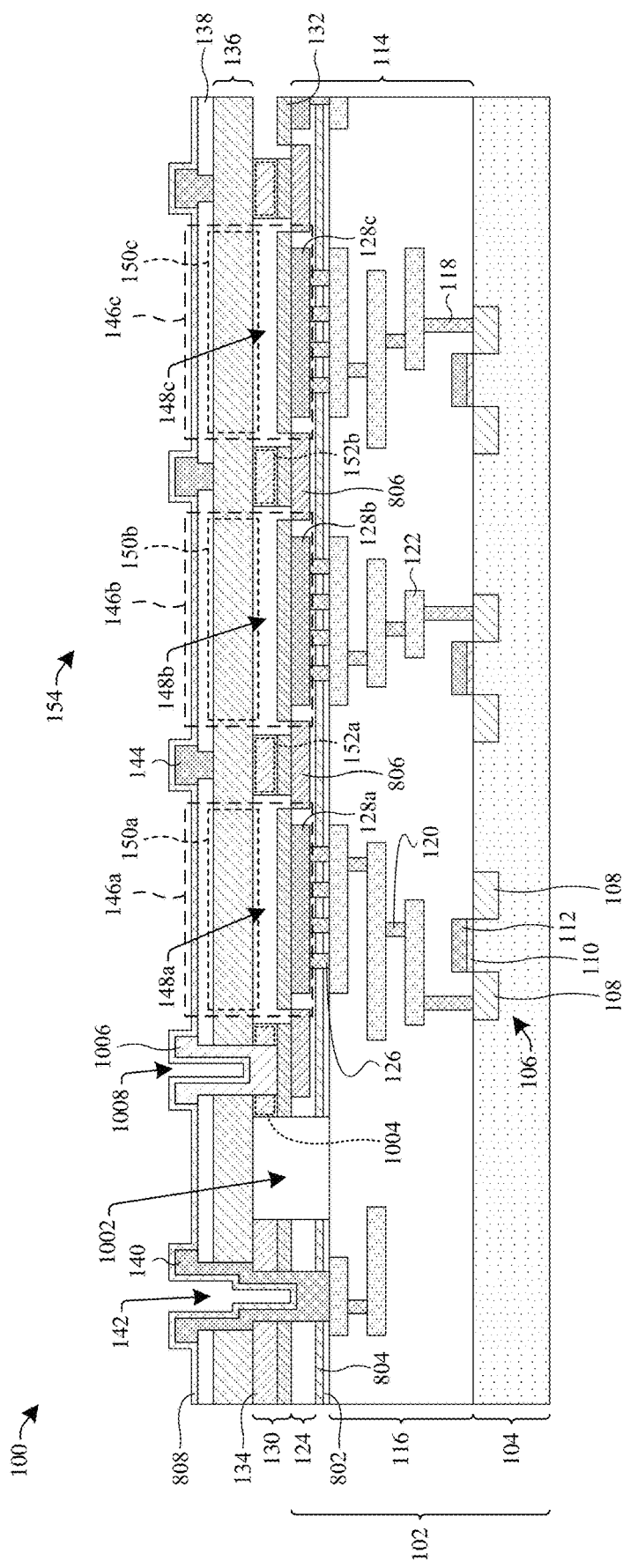

As shown in FIG. 22, a first passivation layer 808 is formed over the MEMS substrate 136, the third dielectric layer 138, the third conductive via 140, the second conductive contacts 144, and the sealing structures 1006. In some embodiments, the first passivation layer 808 may be formed as a conformal layer. In further embodiments, a process for forming the first passivation layer 808 comprises depositing the first passivation layer 808 on the third dielectric layer 138, the third conductive via 140, the second conductive contacts 144, and the sealing structures 1006. The first passivation layer 808 may be deposited by, for example, CVD, PVD, ALD, some other deposition process, or a combination of the foregoing.

In some embodiments, after the first passivation layer 808 is formed, formation of the semiconductor device 100 is complete. The semiconductor device 100 comprises a plurality of MEMS devices 146 that are disposed over the semiconductor substrate 104 and the IC structure 102. The MEMS devices 146 comprise the cavities 148, respectively, a plurality of movable membranes 150, respectively, and the electrodes 128, respectively. In some embodiments, the MEMS devices 146 are part of a MEMS transducer 154.

Because the cavities 148 and the fluid communication channels 152 are hermetically sealed at the reference system pressure, the cavities 148 of the MEMS devices 146 have cavity pressures, respectively (e.g., pressures inside the cavities 148, respectively, after formation of the semiconductor device is complete). Because the fluid communication channels 152 extend laterally between the cavities 148, each of the cavities 148 of the MEMS devices 146 are in fluid communication with one another. Because the cavities 148 of the MEMS devices 146 are in fluid communication with one another, the cavity pressures of the cavities 148 of the MEMS devices 146 are substantially the same. Thus, the fluid communication channels 152 may improve device performance of the semiconductor device 100 (e.g., increased transmission/receiving sensitivity).

Figure 23:
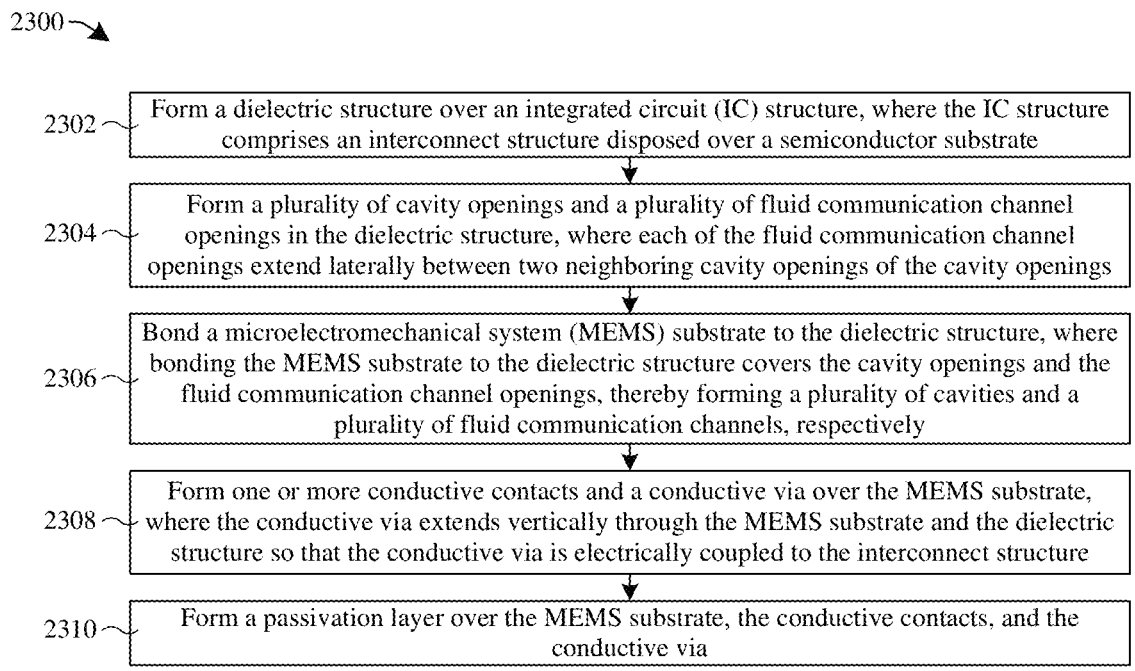
FIG. 23 illustrates a flowchart of some embodiments of a method for forming a semiconductor device having microelectromechanical system (MEMS) devices with improved cavity pressure uniformity.

FIG. 23 illustrates a flowchart of some embodiments of a method for forming a semiconductor device having microelectromechanical system (MEMS) devices with improved cavity pressure uniformity. While the flowchart 2300 of FIG. 23 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2302, a dielectric structure is formed over an integrated circuit (IC) structure, where the IC structure comprises an interconnect structure disposed over a semiconductor substrate. FIG. 14 illustrates a cross-sectional view of some embodiments corresponding to act 2302.

At act 2304, a plurality of cavity openings and a plurality of fluid communication channel openings are formed in the dielectric structure, where each of the fluid communication channel openings extend laterally between two neighboring cavity openings of the cavity openings. FIGS. 15-16 illustrate a series of cross-sectional views of some embodiments corresponding to act 2304.

At act 2306, a microelectromechanical system (MEMS) substrate is bonded to the dielectric structure, where bonding the MEMS substrate to the dielectric structure covers the cavity openings and the fluid communication channel openings, thereby forming a plurality of cavities and a plurality of fluid communication channels, respectively. FIGS. 17-18 illustrate a series of cross-sectional views of some embodiments corresponding to act 2306.

At act 2308, one or more conductive contacts and a conductive via are formed over the MEMS substrate, where the conductive via extends vertically through the MEMS substrate and the dielectric structure so that the conductive via is electrically coupled to the interconnect structure. FIGS. 19-21 illustrate a series of cross-sectional views of some embodiments corresponding to act 2308.

At act 2310, a passivation layer is formed over the MEMS substrate, the conductive contacts, and the conductive via. FIG. 22 illustrates a cross-sectional view of some embodiments corresponding to act 2310.

In some embodiments, the present application provides a semiconductor device. The semiconductor device comprises an interconnect structure disposed over a semiconductor substrate. A dielectric structure is disposed over the interconnect structure. A plurality of cavities are disposed in the dielectric structure and are disposed in an array comprising rows and columns. A microelectromechanical system (MEMS) substrate is disposed over the dielectric structure, wherein the MEMS substrate defines upper surfaces of the cavities, wherein the MEMS substrate comprises a plurality of movable membranes, and wherein the movable membranes overlie the cavities, respectively. A plurality of fluid communication channels are disposed in the dielectric structure, wherein upper surfaces of the fluid communication channels are defined by the MEMS substrate, and wherein each of the fluid communication channels extend laterally between two neighboring cavities of the cavities, such that each of the cavities are in fluid communication with one another.

In some embodiments, the present application provides a semiconductor device. The semiconductor device comprises an interconnect structure disposed over a semiconductor substrate. A dielectric structure is disposed over the interconnect structure. A microelectromechanical system (MEMS) substrate is disposed over the dielectric structure. A first MEMS device is disposed over the semiconductor substrate, wherein the first MEMS device comprises a first cavity disposed in the dielectric structure and comprises a first movable membrane of the MEMS substrate that overlies the first cavity. A second MEMS device is disposed over the semiconductor substrate, wherein the second MEMS device comprises a second cavity disposed in the dielectric structure and comprises a second movable membrane of the MEMS substrate that overlies the second cavity, and wherein the second MEMS device is laterally spaced from the first MEMS device in a first direction. A first fluid communication channel is disposed in the dielectric structure, wherein the first fluid communication channel extends laterally from the first cavity to the second cavity in the first direction, such that the first cavity and the second cavity are in fluid communication.

In some embodiments, the present application provides a method for forming a semiconductor device. The method comprises receiving an integrated circuit (IC) structure comprising a first electrode and a second electrode disposed over a semiconductor substrate of the IC structure, wherein the first electrode is laterally spaced from the second electrode. A dielectric structure is formed over the IC structure, the first electrode, and the second electrode. A first cavity opening is formed in the dielectric structure and overlying the first electrode. A second cavity opening is formed in the dielectric structure and overlying the second electrode, wherein a portion of the dielectric structure is disposed between the first cavity opening and the second cavity opening. A fluid communication channel opening is formed in the portion of the dielectric structure, wherein the fluid communication channel opening extends laterally from the first cavity opening to the second cavity opening. A microelectromechanical system (MEMS) substrate is bonded to the dielectric structure, wherein bonding the MEMS substrate to the dielectric structure covers the first cavity opening, the second cavity opening, and the fluid communication channel opening, thereby forming a first cavity, a second cavity, and a fluid communication channel, respectively, and wherein the fluid communication channel extend laterally from the first cavity to the second cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   receiving an integrated circuit (IC) structure comprising a first electrode and a second electrode disposed over a semiconductor substrate of the IC structure, wherein the first electrode is laterally spaced from the second electrode;
   forming a dielectric structure over the IC structure, the first electrode, and the second electrode;
   forming a first cavity opening in the dielectric structure and overlying the first electrode;
   forming a second cavity opening in the dielectric structure and overlying the second electrode, wherein a portion of the dielectric structure is disposed between the first cavity opening and the second cavity opening;
   forming a fluid communication channel opening in the portion of the dielectric structure, wherein the fluid communication channel opening extends laterally from the first cavity opening to the second cavity opening; and bonding a microelectromechanical system (MEMS) substrate to the dielectric structure, wherein bonding the MEMS substrate to the dielectric structure covers the first cavity opening, the second cavity opening, and the fluid communication channel opening, thereby forming a first cavity, a second cavity, and a fluid communication channel, respectively, and wherein the fluid communication channel extends laterally from the first cavity to the second cavity.

2. The method of claim 1, wherein the first cavity opening, the fluid communication channel opening, and the second cavity opening are formed at a same time by an etching process.

3. A method for forming a semiconductor device, the method comprising:
receiving a workpiece, wherein the workpiece comprises:
a first dielectric structure disposed over a first substrate;
a first electrode disposed in the first dielectric structure and over the first substrate; and
a second electrode disposed in the first dielectric structure and over the first substrate;
forming a second dielectric structure over the first dielectric structure, the first electrode, and the second electrode;
forming a first cavity opening in the second dielectric structure and overlying the first electrode;
forming a second cavity opening in the second dielectric structure and overlying the second electrode;
forming a fluid communication channel opening in the second dielectric structure, wherein the fluid communication channel opening extends laterally from the first cavity opening to the second cavity opening; and
bonding a second substrate to the second dielectric structure, wherein bonding the second substrate to the second dielectric structure covers the first cavity opening, the second cavity opening, and the fluid communication channel opening, thereby respectively forming a first cavity, a second cavity, and a fluid communication channel.

4. The method of claim 3, wherein forming the second dielectric structure comprises:
depositing a first dielectric layer on the first dielectric structure; and
depositing a second dielectric layer on the first dielectric layer.

5. The method of claim 4, wherein:
the fluid communication channel opening is formed with a lower surface that is defined by an upper surface of the second dielectric layer.

6. The method of claim 4, wherein:
the fluid communication channel opening is formed with a lower surface that is defined by an upper surface of the first dielectric layer.

7. The method of claim 4, wherein:
the fluid communication channel opening is formed with a sidewall that is partially defined by a sidewall of the first dielectric layer and partially defined by a sidewall of the second dielectric layer; and
the fluid communication channel opening is formed with a lower surface that is defined by an upper surface of the first dielectric structure.

8. The method of claim 3, wherein bonding the second substrate to the second dielectric structure comprises:
placing the workpiece into a processing chamber; and
adjusting a pressure inside the processing chamber to a predefined pressure, and wherein the second substrate is bonded to the second dielectric structure while the processing chamber is at the predefined pressure.

9. The method of claim 3, further comprising:
forming a buffer tank opening in the second dielectric structure; and
forming a buffer tank channel opening in the second dielectric structure, wherein the buffer tank channel opening extends laterally from the first cavity opening to the buffer tank opening, and wherein bonding the second substrate to the second dielectric structure covers the buffer tank opening and the buffer tank channel opening, thereby respectively forming a buffer tank and a buffer tank channel.

10. The method of claim 9, wherein:
the buffer tank channel opening is formed with a lower surface that is defined by an upper surface of the second dielectric structure; and
the buffer tank opening is formed with a lower surface that is defined by an upper surface of the first dielectric structure; and
the upper surface of the first dielectric structure is disposed vertically between the upper surface of the second dielectric structure and the first substrate.

11. The method of claim 9, further comprising:
after the second substrate is bonded to the second dielectric structure, forming a sealing structure in the buffer tank channel, wherein the sealing structure forms a hermetic seal between the buffer tank and the first cavity.

12. The method of claim 11, wherein forming the sealing structure comprises:
forming a sealing structure opening in the second substrate and overlying the buffer tank channel, wherein forming the sealing structure opening exposes the buffer tank channel; and
depositing a sealing layer on the second substrate, in the sealing structure opening, and in the buffer tank channel.

13. The method of claim 12, wherein forming the sealing structure further comprises:
placing the workpiece into a processing chamber; and
adjusting a pressure inside the processing chamber to a predefined pressure, and wherein the sealing layer is deposited in the processing chamber while the processing chamber is at the predefined pressure.

14. A method of forming a semiconductor device, the method comprising:
receiving a workpiece comprising a first dielectric structure over a first substrate;
depositing a second dielectric structure over both the first dielectric structure and the first substrate;
etching the second dielectric structure to form a plurality of cavity openings in the second dielectric structure, wherein each of the cavity openings are laterally spaced;
etching the second dielectric structure to form a plurality of fluid communication channel openings in the second dielectric structure, wherein each of the fluid communication channel openings extends laterally between two neighboring cavity openings of the plurality of cavity openings; and
bonding a second substrate that covers the plurality of cavity openings and the plurality of fluid communication channel openings to the second dielectric structure, thereby forming a plurality of cavities and a plurality of fluid communication channels in the second dielectric structure, wherein bonding the second substrate to the second dielectric structure hermetically seals the plurality of cavities and the plurality of fluid communication channels at a first pressure.

15. The method of claim 14, further comprising:
forming a buffer tank opening in the second dielectric structure; and
forming a plurality of buffer tank channel openings in the second dielectric structure, wherein each of the buffer tank channel openings extends laterally from the buffer tank opening to a corresponding one of the plurality of cavity openings, wherein bonding the second substrate to the second dielectric structure covers the buffer tank opening and the buffer tank channel openings, thereby forming a buffer tank and a plurality of buffer tank channels in the second dielectric structure, and wherein bonding the second substrate to the second dielectric structure hermetically seals the buffer tank and the plurality of buffer tank channels at the first pressure.

16. The method of claim 15, further comprising:
after the second substrate is bonded to the second dielectric structure, forming a plurality of sealing structure openings penetrating the second substrate, wherein each of the plurality of sealing structure openings exposes a corresponding one of the plurality of buffer tank channels; and
forming a plurality of sealing structures in the plurality of sealing structure openings and in the plurality of buffer tank channels, wherein the plurality of sealing structures hermetically seal the plurality of cavities and the plurality of fluid communication channels at a second pressure different than the first pressure.

17. The method of claim 14, wherein:
the plurality of cavity openings comprises a first cavity opening having a first center point, a second cavity opening having a second center point, and a third cavity opening having a third center point;
the plurality of fluid communication channel openings comprises a first fluid communication channel opening and a second fluid communication channel opening;
the first center point, the second center point, and the first fluid communication channel opening are aligned along a first plane that extends in a first direction in a substantially straight line;
the first center point, the third center point, and the second fluid communication channel opening are aligned along a second plane that extends in a second direction in a substantially straight line;
the second plane is perpendicular to the first plane; and
the first plane intersect the second plane at the first center point.

18. The method of claim 17, wherein:
the plurality of cavity openings comprises a fourth cavity opening having a fourth center point that is aligned with the first center point along the first plane; and
the plurality of fluid communication channel openings comprises a third fluid communication channel opening that is aligned with the first center point along the first plane.

19. The method of claim 18, wherein:
the plurality of cavity openings comprises a fifth cavity opening having a fifth center point that is aligned with the first center point along the second plane; and
the plurality of fluid communication channel openings comprises a fourth fluid communication channel opening that is aligned with the first center point along the second plane.

20. The method of claim 14, wherein each of the plurality of cavity openings are formed with a top-view outline that is circular-shaped.

\* \* \* \* \*